(12) United States Patent
Sasaki et al.

(10) Patent No.: US 7,002,529 B2
(45) Date of Patent: Feb. 21, 2006

(54) DATA PROCESSING TERMINAL, TERMINAL DESIGNING APPARATUS AND METHOD, COMPUTER PROGRAM, AND INFORMATION STORING MEDIUM

(75) Inventors: Hideki Sasaki, Minato-ku (JP);
Masaharu Imazato, Minato-ku (JP);
Yuji Muramatsu, Kakegawa (JP);
Toshio Kaku, Kakegawa (JP);
Hidenori Muramatsu, Kakegawa (JP);
Toshihide Kuriyama, Minato-ku (JP);
Takashi Yoshinaga, Minato-ku (JP)

(73) Assignee: NEC Corporation, Tokyo (JP)

( * ) Notice: Subject to any disclaimer, the term of this patent is extended or adjusted under 35 U.S.C. 154(b) by 117 days.

(21) Appl. No.: 10/474,426

(22) PCT Filed: Mar. 11, 2002

(86) PCT No.: PCT/JP02/02238

§ 371 (c)(1),
(2), (4) Date: Oct. 9, 2003

(87) PCT Pub. No.: WO02/084893

PCT Pub. Date: Oct. 24, 2002

(65) Prior Publication Data

US 2004/0125039 A1  Jul. 1, 2004

(30) Foreign Application Priority Data

Apr. 11, 2001  (JP) .............................. 2001-112961

(51) Int. Cl.
*H01Q 1/48* (2006.01)
(52) U.S. Cl. ..................... 343/846; 343/702; 455/90.3
(58) Field of Classification Search ................ 343/846, 343/848, 702, 841; 455/89, 90.3
See application file for complete search history.

(56) References Cited

U.S. PATENT DOCUMENTS

| | | | | |
|---|---|---|---|---|
| 5,198,824 A | * | 3/1993 | Poradish ............... | 343/700 MS |
| 5,420,596 A | * | 5/1995 | Burrell et al. ........ | 343/700 MS |
| 5,428,362 A | * | 6/1995 | Chatzipetros et al. ........ | 343/702 |
| 5,801,660 A | * | 9/1998 | Ohtsuka et al. ...... | 343/700 MS |
| 6,542,050 B1 | * | 4/2003 | Arai et al. ................... | 333/134 |
| 6,774,641 B1 | * | 8/2004 | Sasaki et al. ............... | 324/627 |
| 2005/0017918 A1 | * | 1/2005 | Sasaki et al. ............... | 343/846 |

FOREIGN PATENT DOCUMENTS

| | | |
|---|---|---|
| JP | 8-8618 A | 1/1996 |
| JP | 8-148878 A | 6/1996 |

OTHER PUBLICATIONS

K. Fujimoto et al., "Small Antennas", Research Studies Press, Chapter 2.4, pp. 116-151.

* cited by examiner

*Primary Examiner*—Tan Ho
(74) *Attorney, Agent, or Firm*—Sughrue Mion, PLLC

(57) ABSTRACT

Second ground plane (18), substantially rectangular in shape, is connected to first ground plane (17) mounted with a data processing circuit, and radio communication circuit (12) makes radio communications at communication wavelength λ. A portion of second ground plane (18) from ground connecting means (14) to ground connecting means (33) along continuous edges of second ground plane (18) acts as an antenna. However, since the longest distance a between a plurality of ground connecting means (14, 33) along the continuous edges of second ground plane (18) satisfies "a<λ/2α" (where α is a coefficient equal to or larger than "1"), its resonant frequency is sufficiently higher than the communication frequency of the radio communication circuit.

123 Claims, 25 Drawing Sheets

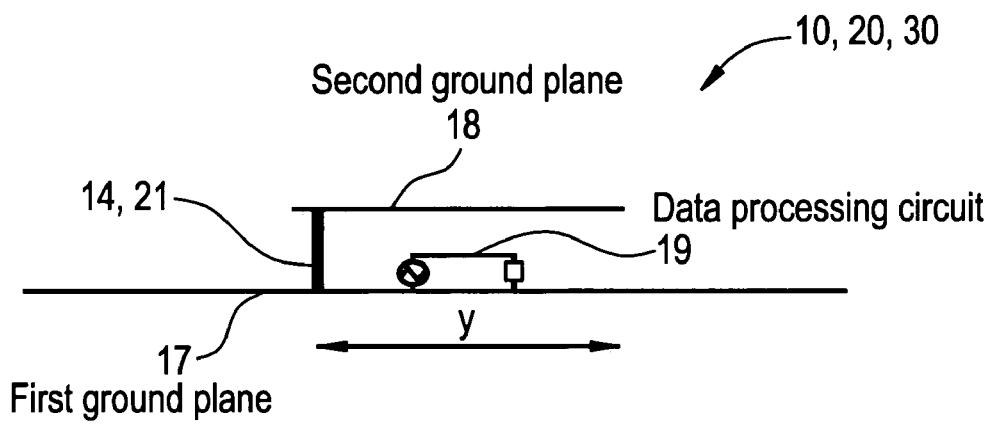
FIG. 4 PRIOR ART
FIG. 5A
FIG. 5B
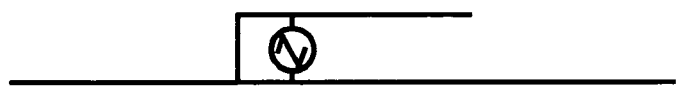

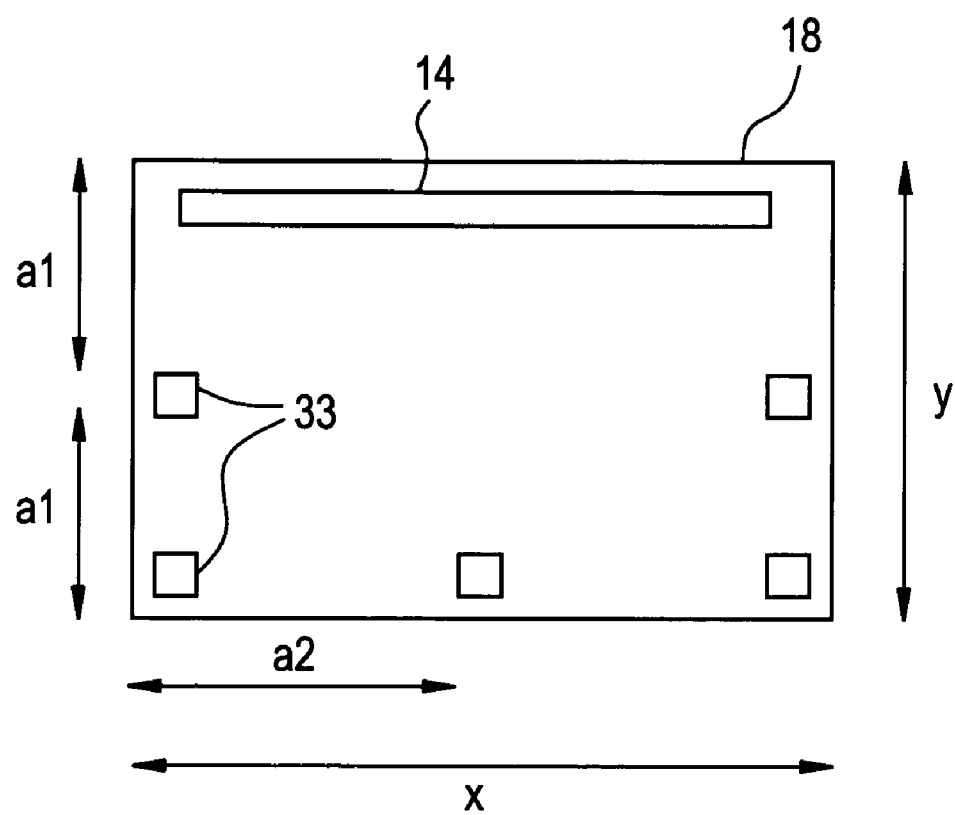

105
Metal member

DATA PROCESSING TERMINAL, TERMINAL DESIGNING APPARATUS AND METHOD, COMPUTER PROGRAM, AND INFORMATION STORING MEDIUM

This application is a 371 of PCT/JP02/02238 filed on Mar. 11, 2002.

TECHNICAL FIELD

The present invention relates to a data processing terminal for executing data processing near a radio communication circuit which makes radio communications at a predetermined communication wavelength $\lambda$, a terminal designing apparatus and method for use in designing the data processing terminal, a computer program for the terminal designing apparatus, and an information storage medium which has stored thereon the computer program.

BACKGROUND ART

At present, a variety of user terminal devices are widespread among general users. For example, there is even a data processing terminal which executes a variety of user supports as PDA (Personal Digital Assistance) and communicates its processed data using a PHS (Personal Handyphone System: a registered trademark) function over the air. Here, a first conventional example of such data processing terminal will be described below with reference to FIG. 1.

First, data processing terminal 10 comprises a hollow housing (not shown), and a parent board 11 disposed inside the housing (not shown). Parent board 11 comprises a large rectangular circuit board which is mounted with a variety of data processing circuits (not shown) comprised of integrated circuits.

Data processing terminal 10 has a user interface (not shown) such as a touch panel formed on the surface of the housing, so that a data processing circuit on parent board 11 executes a variety of data processing in response to data entered through the user interface.

A card slot (not shown) is also formed on one end of the housing, and a separate card-shaped radio communication unit 12 is removably plugged into the card slot. Radio communication unit 12 comprises a radio communication circuit (not shown) contained therein, and a rod-like antenna 13 protruding therefrom. Radio communication unit 12 has a PHS function to communicate with the outside in a frequency band near 1.9 (GHz) over the air.

In data processing terminal 10, as card-shaped radio communication unit 12 is plugged into the card slot of the housing, the radio communication circuit in radio communication unit 12 is connected to the data processing circuit on parent board 11 to establish a wired communication available condition.

One of a pair of connectors 14 is mounted on parent board 11, while the other of the pair of connectors 14 is mounted on child board 15, so that child board 15 is removably mounted on parent board 11 through connectors 14. Child board 15 comprises a small rectangular circuit board which is mounded with a memory circuit (not shown) such as RAM (Random Access Memory), a flash memory, or the like.

Parent board 11 is substantially entirely formed with a first ground plane made of a metal, and child board 15 is likewise substantially entirely formed with a second ground plane made of a metal (not shown), such that these ground planes determine a potential reference of data processing terminal 10.

Connectors 14 have a multiplicity of signal terminals and a multiplicity of ground terminals arranged in parallel with one another, wherein one ground terminal is inserted, for example, per three signal terminals.

Thus, as child board 15 is mounted on parent board 11 through connectors 14, the signal terminals of connectors 14 connect the data processing circuit on parent board 11 to the memory circuit of child board 5, while the ground terminals of connectors 14 connect the first ground plane of parent board 11 to the second ground plane of child board 15.

In the configuration as described above, data processing terminal 10 is responsive, for example, to data entered through a user interface or the like to cause the data processing circuit to execute a variety of data processing and deliver processed data from the user interface, thereby serving as PDA to provide user supports.

Also, since data processing terminal 10 makes radio communications with the outside through radio communication unit 12 as required, data processing terminal 10 can transmit data processed by the data processing circuit over the air, and processes processed data received through radio communications in the data processing circuit. Further, since data processed by the data processing circuit is stored in the memory circuit of child board 15, the data processing circuit can execute a large capacity of data processing.

While data processing terminal 10 herein illustrated has child board 15 mounted on parent board 11 through a pair of connectors 14 which are removable in the vertical direction, there is also a product, as data processing terminal 20 illustrated in FIG. 2, wherein child board 15 is mounted to and removed from connector 21 in the horizontal direction.

Also, as data processing terminal 30 illustrated in FIG. 3, there is a product which comprises parent board 11 and child board 15 formed with ground terminals 31, 32 electrically connected to a first ground plane and a second ground plane, respectively, formed on the front surfaces or back surfaces thereof, with ground terminals 31, 32 being electrically connected through tubular metal columns 34 or screws 35 of auxiliary connecting means 33. Such metal columns 34 and screws 35 are generally intended to mechanically hold child board 15, so that they are disposed near a pair of corners at diagonal positions of rectangular child board 15.

However, in the aforementioned data processing terminal 10, 20, first ground plane 17 of parent board 11 and second ground plane 18 of child board 15 connected through connectors 14, 21 are positioned in parallel with each other, as illustrated in FIG. 4, where data processing circuit 19 composed of a multiplicity of electronic parts such as LSIs (Large Scale Integration), and signal wires is mounted on first ground plane 17 of parent board 11.

Since data processing circuit 19 transmits repetitive signals and non-repetitive signals at particular frequencies among circuits when it processes data, an electromagnetic field is generated near such circuits, associated with frequency components and harmonic components of the transmitted signals. This electromagnetic field not only causes a high frequency current to flow into first ground plane 17 of parent board 11 but also induces a high frequency current into second ground plane 18 of child board 15 disposed in the neighborhood.

The inventors found that the ground structure comprised of first ground plane 17 of parent board 11, second ground plane 18 of child board 15, and the ground terminals of connectors 14 as illustrated in FIG. 4 resembled an antenna element of a quarter wavelength resonant antenna referred to as an "inverted L-shaped antenna" or an "inverted F-shaped antenna" (reference: "Small Antennas" K. Fujimoto, A. Henderson and J. R. James, Research Studies Press, Chapter 2.4).

In this event, second ground plane 18 of child board 15 has an edge close to connector 14 that corresponds to a short-circuited end of the antenna element, and an edge opposite to connector 14 that corresponds to an open end of the antenna element. On this assumption, a strong electromagnetic field is generated around second ground plane 18 due to frequency components of a current induced into second ground plane 18 by data processing circuit 19, which cause quarter wavelength resonance in second ground plane 18, thereby affecting radio communication unit 12.

For example, child board 15 having a memory circuit mounted thereon has edges extending over approximately 25 to 75 (mm), so that the quarter wavelength resonance occurs at frequency in a range of approximately 1 to 3 (GHz). On the other hand, since conventional data processing circuit 19 has a basic frequency around several MHz, its harmonics are also on the order of 100 (MHz). As such, the aforementioned ground structure is conventionally free from the quarter wavelength resonance because harmonic components of data processing circuit 19 are largely lower than the frequency of the quarter wavelength resonance in the ground structure.

Recently, however, the trend of faster processing operations has increased the basic frequency of data processing circuit 19 to several hundred MHz, and its harmonics are also as high as several GHz. For this reason, the aforementioned ground structure suffers from the quarter wavelength resonance, and an electromagnetic field of high intensity generated by the ground structure strongly couples to radio communication unit 12 positioned in the neighborhood to impede its radio communications.

Particularly, since frequency bands available for communications are approximately 1.9 (GHz) in PHS; approximately 800 (MHz), approximately 1.5 (GHz), and approximately 2.0 (GHz) in portable telephone; and approximately 2.4 (GHz) in radio LAN (Local Area Network) and Bluetooth, such radio communications will be impeded by the quarter wavelength resonance of the ground structure if it occurs at frequency in a range of approximately 1 to 3 (GHz) as mentioned above.

While it has been predicted from before that the electromagnetic field generated by data processing circuit 19 affects radio communication unit 12, and countermeasures have been taken therefor, nobody has been able to predict that the operation of data processing circuit 19 on parent board 11 causes child board 15 and the like to act as a resonant antenna, and an electromagnetic field generated thereby affects radio communication unit 12.

Describing the phenomenon in a more specific manner, when radio communication unit 12 makes a radio communication at a predetermined frequency, second ground plane 18 generates a strong electromagnetic field at the communication frequency if distance y from connector 14, 21 of child board 15 to the distal edge thereof is approximate to the quarter wavelength of communication waves, as illustrated in FIGS. 1, 2, 4.

The inventors have also confirmed that when connector 14, 21 is positioned along one edge of child board 15 as illustrated in FIG. 6, second ground plane 18 generates a strong electromagnetic field at a communication frequency even if extent a of a plurality of continuous edges of second ground plane 18 from one end to the other end of connector 14, 21 is approximate to the half wavelength of communication waves.

The cause is different from the cause by which the electromagnetic field is generated at the communication frequency due to the aforementioned distance y approximate to the quarter wavelength, and it is predicted that this is because the intensity of the electromagnetic field is not consistent in the longitudinal direction of connector 14, 21 since the length of child substrate 15 in this direction is neither "0" nor infinity,.

Therefore, in the structure in which connector 14, 21 is positioned along one edge of rectangular child board 15 as illustrated in FIGS. 1, 2, 4, second ground plane 18 generates a strong electromagnetic field at a communication frequency even if distance y from connector 14, 21 to the distal edge of child board 15 is approximate to the quarter wavelength of communication waves, or even if extent a of a plurality of continuous edges of second ground plane 18 from one end to the other end of connector 14, 21 is approximate to the half wavelength of communication waves.

On the other hand, in the aforementioned data processing terminal 30, connector 14 is positioned along one edge of child board 15, and auxiliary connecting means are positioned near a pair of corners at diagonal positions, as illustrated in FIG. 7. Thus, second ground plane 18 generates a strong electromagnetic field at a communication frequency particularly when the longest distance a2 is approximate to the half wavelength of communication waves, out of distances a1, a2 from connector 14 to auxiliary connecting means 33 on a plurality of continuous edges of second ground plane 18.

It is predicted that this is because both connector 14 and auxiliary connecting means 33 act as short-circuited ends, so that second ground plane 18 resonates near the half wavelength of the communication waves. Likewise, in this event, the electromagnetic field generated by the ground structure at a communication wavelength due to the resonance impedes radio communications made by radio communication unit 12 positioned in the neighborhood.

Further, in the aforementioned data processing terminal 10, 20, 30, removably connected radio communication unit 12 is impeded in its radio communications, wherein such impediment to radio communications will occur when radio communication unit 12 is positioned near the ground structure.

Thus, communication failures are likewise experienced even by a radio communication circuit which is connected to a data processing terminal as described above through a connection cable or the like, and communication failures are likewise experienced even by a separate radio communication circuit which is not connected to a data processing terminal as described above but is used in the neighborhood (not shown).

To solve the challenges as mentioned above, child board 15 and second ground plane 18 should be formed to be sufficiently small or large with respect to the communication wavelength. However, since the dimensions of child board 15 are restricted to the size of a memory circuit mounted thereon and have been reduced to a possible extent even at present, child board 15 cannot be thoughtlessly reduced more in size. Also, as a matter of course, as child board 15 is increased in size, data processing terminal 10, 20, 30 are also increased in size, thereby impairing the portability and the like.

It is also possible to place child board 15 within a metal case (not shown) to isolate radio communication unit 12 from a strong electromagnetic field generated by child board 15. However, even with the structure using the metal case for shielding overall child board 15 in this way, the metal case results in an increased size of data processing terminal 10, 20, 30.

DISCLOSURE OF THE INVENTION

The present invention has been made in view of the problems as mentioned above, and it is an object of the invention to provide a data processing terminal which reduces the generation of an electromagnetic field that impedes radio communications at a predetermined frequency, a terminal designing apparatus and method for use in designing the data processing terminal, a computer program for the terminal designing apparatus, and an information storage medium having the computer program stored thereon.

A first data processing terminal according to the present invention has a data processing circuit connected to at least one of a first ground plane and a second ground plane, where a radio communication circuit in wired communication with the data processing circuit makes radio communications with the outside at predetermined communication wavelength $\lambda$. The second ground plane is formed in a predetermined shape having a plurality of edges and a plurality of corners, while the first ground plane has a larger area and a larger capacitance than the second ground plane, and is positioned substantially in parallel. A plurality of ground connecting means connect the second ground plane to the first ground plane individually at a plurality of positions. However, the longest distance a between the plurality of ground connecting means along the continuous edges of the second ground plane satisfies "$a<\lambda/2\alpha$" (where $\alpha$ is a coefficient equal to or larger than "1").

Accordingly, although a portion of the second ground plane along the continuous edges thereof from the ground connecting means to the ground connecting means can give rise to half wavelength resonance due to an electromagnetic field generated by the data processing circuit, radio communications will not be impeded because the resonant frequency is sufficiently higher than the communication frequency of the radio communication circuit.

In another embodiment of the data processing terminal as described above, the longest distance b from a corner on one edge of the second ground plane to the ground connecting means satisfies "$b<\lambda/4\alpha$".

Accordingly, although a portion of the second ground plane from the corner on the one edge to the ground connecting means can also give rise to quarter wavelength resonance due to an electromagnetic field generated by the data processing circuit, radio communications will not be impeded because the resonant frequency is sufficiently higher than the communication frequency of the radio communication circuit.

Alternatively, the ground connecting means comprise an elongated connector and at least one point-like auxiliary connecting means, wherein the connector is positioned near one edge of the second ground plane substantially in parallel therewith, and the auxiliary connecting means is positioned near one edge substantially in parallel with the connector.

Accordingly, the one edge of the second ground plane is linearly connected to the first ground plane, and the edge substantially parallel with that edge is connected to the first ground plane at least at one point.

Alternatively, the ground connecting means comprise a connector and linear auxiliary connecting means, wherein the connector is positioned near one edge of the second ground plane substantially in parallel therewith, and the auxiliary connecting means is positioned near one edge substantially in parallel with the connector, Accordingly, the two edges of the second ground plane substantially in parallel with each other are linearly connected to the first ground plane.

Alternatively, the ground connecting means comprise a connector and at least two point-like auxiliary connecting means, wherein the connector is positioned near one edge of the second ground plane substantially in parallel therewith, and the auxiliary connecting means are positioned at least one by one near two edges substantially orthogonal to the connector.

Accordingly, the one edge of the second ground plane is connected to the first ground plane, and each of two edges substantially orthogonal to that edge is connected to the first ground plane at least at one point.

Alternatively, the ground connecting means comprise a connector and two linear auxiliary connecting means, wherein the connector is positioned near one edge of the second ground plane substantially in parallel therewith, and the auxiliary connecting means are linearly positioned respectively near two edges substantially orthogonal to the connector, and arranged substantially in parallel with the edges, Accordingly, the one edge of the second ground plane is connected to the first ground plane, and each of the two edges substantially orthogonal to that edge is linearly connected to the first ground plane.

Alternatively, the ground connecting means comprise a connector, first linear auxiliary connecting means, and second point-like auxiliary connecting means, wherein the connector is positioned near one edge of the second ground plane in parallel therewith, the first auxiliary connecting means is positioned near one edge substantially orthogonal to the connector substantially in parallel therewith, and the second auxiliary connecting means is positioned near a corner at which two edges, near which neither the connector nor the first auxiliary connecting means is positioned, intersect with each other.

Accordingly, the second ground plane is connected to the first ground plane along two substantially orthogonal edges, and is additionally connected to the first ground plane at a corner at which two edges different from these two edges intersect with each other.

Alternatively, the ground connecting means comprise a connector and at least two linear auxiliary connecting means, wherein the connector is positioned halfway between two edges of the second ground plane opposite to each other and arranged substantially in parallel with the edges, and the auxiliary connecting means are positioned respectively near two edges substantially in parallel with the connector and arranged in parallel with the edges.

Accordingly, the two edges substantially parallel with each other and a central portion of the second ground plane are linearly connected to the first ground plane substantially in parallel therewith.

Alternatively, the ground connecting means comprise a connector and at least two point-like auxiliary connecting means, wherein the connector is positioned halfway between two edges of the second ground plane opposite to each other substantially in parallel therewith, and the auxiliary connecting means are positioned at least one by one near two edges substantially orthogonal to the connector.

Accordingly, a central portion of the second ground plane is linearly connected to the first ground plane substantially in parallel with the two edges, and each of the two edges substantially orthogonal to the edge is connected to the first ground plane at least at one position.

Alternatively, the ground connecting means comprise a connector and at least two linear auxiliary connecting means, wherein the connector is positioned halfway between two edges of the second ground plane opposite to each other substantially in parallel therewith, and the auxiliary connecting means are positioned near two edges substantially orthogonal to the connector substantially in parallel therewith, respectively.

Accordingly, a central portion of the second ground plane is linearly connected to the first ground plane substantially in parallel with the two edges, and each of the two edges substantially orthogonal to that edge is linearly connected to the first ground plane.

In a second data processing terminal of the present invention, a connector linearly connects a second ground plane to a first ground plane at an intermediate position substantially in parallel with two edges opposite to and substantially in parallel with each other, wherein the longest distance a from one end to the other end of the connector along continuous edges of the second ground plane satisfies "a<$\lambda/2\alpha$" (where $\alpha$ is a coefficient equal to or larger than "1").

Accordingly, although a portion of the second ground plane along the continuous edges thereof from the ground connecting means to the ground connecting means can give rise to half wavelength resonance due to an electromagnetic field generated by a data processing circuit, radio communications will not be impeded because the resonant frequency is substantially higher than a communication frequency of the radio communication circuit.

Also, the longest distance b from a corner on one edge of the second ground plane to the ground connecting means satisfies "b<$\lambda/4\alpha$".

Accordingly, although a portion of the ground plane from the corner on the one edge to the ground connecting means can also give rise to quarter wavelength resonance due to an electromagnetic field generated by the data processing circuit, radio communications will not be impeded because the resonant frequency is sufficiently higher than the communication frequency of the radio communication circuit.

Alternatively, the first ground plane, which comprises a first ground plane of a parent board mounted with a data processing circuit, is removably connected to the second ground plane, which comprises a first ground plane of a child board mounted with a memory circuit for temporarily storing data processed by the data processing circuit, through the connector, which comprises a connector.

Accordingly, though the child board connected to the parent board through the connector causes the child board to act as a resonant antenna which resonates with an electromagnetic field generated by the data processing circuit on the parent board, the resonant frequency is sufficiently higher than the communication frequency of the radio communication circuit.

In a third data processing circuit of the present invention, a second ground plane is linearly connected to a first ground plane near four edges thereof substantially in parallel therewith by a ground connecting means.

Accordingly, the second ground plane will not act as an antenna which resonates with an electromagnetic field generated by a data processing circuit.

In a first terminal designing method based on a terminal designing apparatus of the present invention, as communication wavelength $\lambda$ is entered through wavelength input means, the entered communication wavelength $\lambda$ is stored in wavelength storing means. As coefficient $\alpha$ equal to or larger than "1" is entered through coefficient input means, the entered coefficient $\alpha$ is stored in coefficient storing means. As the lengths of two substantially orthogonal edges of a second ground plane are entered through length input means, the two entered lengths of the edges are stored in length storing means. Then, pattern generating means generates, based on a variety of stored data, a layout pattern for a plurality of ground connecting means such that the longest distance a of the plurality of ground connecting means along continuous edges of the second ground plane satisfies "a<$\lambda/2\alpha$".

Accordingly, as the second ground plane of a data processing terminal is connected to the first ground plane through the plurality of ground connecting means corresponding to the generated layout pattern, a portion of the second ground plane along the continuous edges thereof from the ground connecting means to the ground connecting means can give rise to half wavelength resonance due to an electromagnetic field generated by a data processing circuit, but radio communications will not be impeded because the resonant frequency is sufficiently higher than a communication frequency of a radio communication circuit.

Also, the pattern generating means generates a layout pattern such that the longest distance b from a corner on one edge of the second ground plane to the ground connecting means satisfies "b<$\lambda/4\alpha$".

Accordingly, as the second ground plane of the data processing terminal is connected to the first ground plane through a plurality of ground connecting means corresponding to the generated layout pattern, a portion of the second ground plane from the corner on the one edge to the ground connecting means can also give rise to quarter wavelength resonance due to an electromagnetic field generated by the data processing circuit, but radio communications will not be impeded because the resonant frequency is sufficiently higher than the communication frequency of the radio communication circuit.

In another embodiment of the terminal designing method based on the terminal designing apparatus as described above, a layout pattern for a connector substantially parallel with one edge of the second ground plane is entered through pattern input means, and the entered layout for the connector is stored in pattern storing means. Auxiliary generating means generates a layout pattern for auxiliary connecting means corresponding to the stored layout pattern for the connector.

Accordingly, a layout pattern for the auxiliary connecting means is generated corresponding to the layout pattern for the connector.

In a second terminal designing method based on a terminal designing apparatus of the present invention, as communication wavelength $\lambda$ is entered through wavelength input means, the entered communication wavelength $\lambda$ is stored in wavelength storing means. As coefficient $\alpha$ equal to or larger than "1" is entered through coefficient input means, the entered coefficient $\alpha$ is stored in coefficient storing means. As the lengths of two substantially orthogonal edges of a second ground plane are entered through length input means, the two entered lengths of the edges are stored in length storing means. As a layout pattern for a plurality of ground connecting means are entered through pattern input means, the entered layout pattern is stored in pattern storing means. Then, pattern confirming means confirms, based on the data stored in a variety of storing means, that the longest distance a between a plurality of ground connecting means along continuous edges of the second ground plane satisfies "a<λ/2α".

Accordingly, as the second ground plane of a data processing terminal is connected to the first ground plane through the plurality of ground connecting means in accordance with the confirmed layout pattern, a portion of the second ground plane along the continuous edges thereof from the ground connecting means to the ground connecting means can give rise to half wavelength resonance due to an electromagnetic field generated by a data processing circuit, but radio communications will not be impeded because the resonant frequency is sufficiently higher than a communication frequency of a radio communication circuit.

Also, the pattern confirming means confirms that the longest distance b from a corner on one edge of the second ground plane to the ground connecting means satisfies "b<λ/4α".

Accordingly, as the second ground plane of the data processing terminal is connected to the first ground plane through a plurality of ground connecting means in accordance with the confirmed layout pattern, a portion of the second ground plane from the corner on the one edge to the ground connecting means can also give rise to quarter wavelength resonance due to an electromagnetic field generated by the data processing circuit, but radio communications will not be impeded because the resonant frequency is sufficiently higher than the communication frequency of the radio communication circuit.

The predetermined shape as referred to in the present invention may be any shape that comprise a plurality of edges and a plurality of corners, and contemplates, for example, a rectangular shape which has four edges and four corners, and the like. While the continuous edges of the second ground plane are assumed to be a plurality of edges which are continuous through corners, a single edge is contemplated as a special resolution thereof.

Also, the linear shape as referred to in the present invention may be any shape that can be recognized as a generally elongated line segment, and contemplates, for example, a two-dimensional shape which has a predetermined line width, a shape on which a plurality of points are arranged in sequence, and the like. The point-like shape may be any shape that can be recognized as a generally single point, and contemplates, for example, a two-dimensional shape which has a predetermined area.

Also, a variety of means as referred to in the present invention may be formed to implement functions associated therewith, and contemplate, for example, dedicated hardware for performing predetermined functions, a terminal designing apparatus provided with predetermined functions by a computer program, predetermined functions implemented within a terminal designing apparatus by a computer program, a combination of them, and the like. Also, a variety of means as referred to in the present invention need not be individually independent existence, but contemplate a certain means forming part of another means.

The information storage medium as referred to in the present invention may be hardware which has a computer program previously stored therein for causing a terminal designing apparatus to execute a variety of processing, and contemplates, for example, ROM (Read Only Memory) and/or HDD (Hard Disc Drive) resident in an apparatus which comprises the terminal designing apparatus, CD (Compact Disc)-ROM and/or FD (Floppy Disc) exchangeably loaded into the apparatus which comprises the terminal designing apparatus, and the like.

Also, the terminal designing apparatus as referred to in the present invention may be any hardware that can read a computer program to execute corresponding processing operations, and contemplates, for example, hardware which mainly based on a CPU (Central Processing Unit) connected to a variety of devices such as ROM, RAM, I/F (Interface) unit, and the like.

In the present invention, causing the terminal designing apparatus to execute a variety of operations in accordance with a computer program also contemplates causing the terminal designing apparatus to control the operation of various devices. For example, storage of a variety of data in the terminal designing apparatus contemplates storing a variety of data in an information storage medium such as RAM which is contained in the terminal designing apparatus as its part, storing a variety of data in an information storage medium such as FD which is exchangeably loaded into the terminal designing apparatus, and the like.

BRIEF DESCRIPTION OF THE DRAWINGS

FIG. 4 is a schematic diagram illustrating the electric structure composed of a first ground plane, a second ground plane, and the like in the first exemplary conventional data processing terminal;

FIG. 5A is a schematic diagram illustrating the structure of an inverted L-shaped antenna;

FIG. 5B is a schematic diagram illustrating the structure of an inverted F-shaped antenna;

FIG. 9 is a schematic diagram illustrating the electric structure composed of a first ground plane, a second ground plane, and the like;

FIG. 20 is a top plan view illustrating a layout pattern for the connector and auxiliary connecting means on the second ground plane;

BEST MODE FOR CARRYING OUT THE INVENTION

Figure 1:
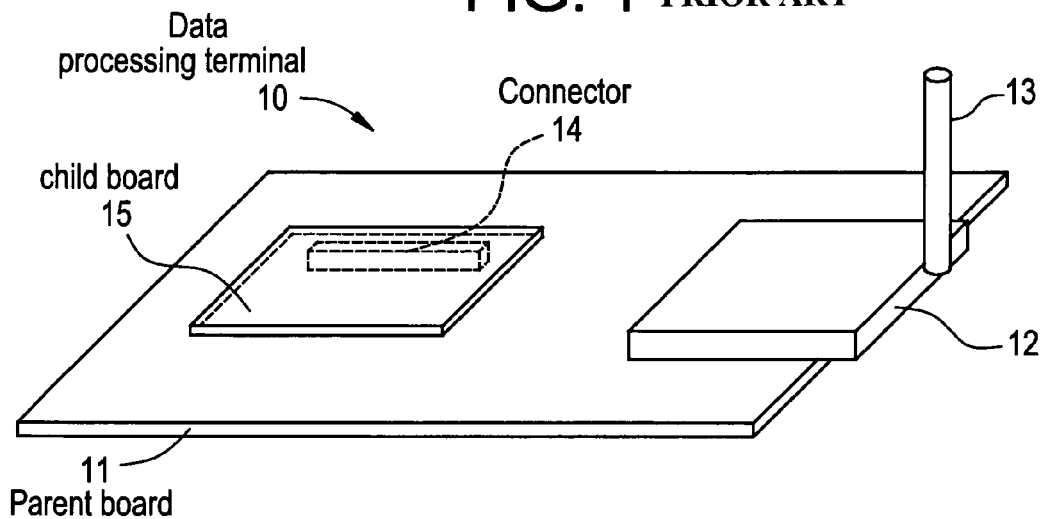
FIG. 1 is a perspective view illustrating the internal structure of a first exemplary conventional data processing terminal.
Figure 2:
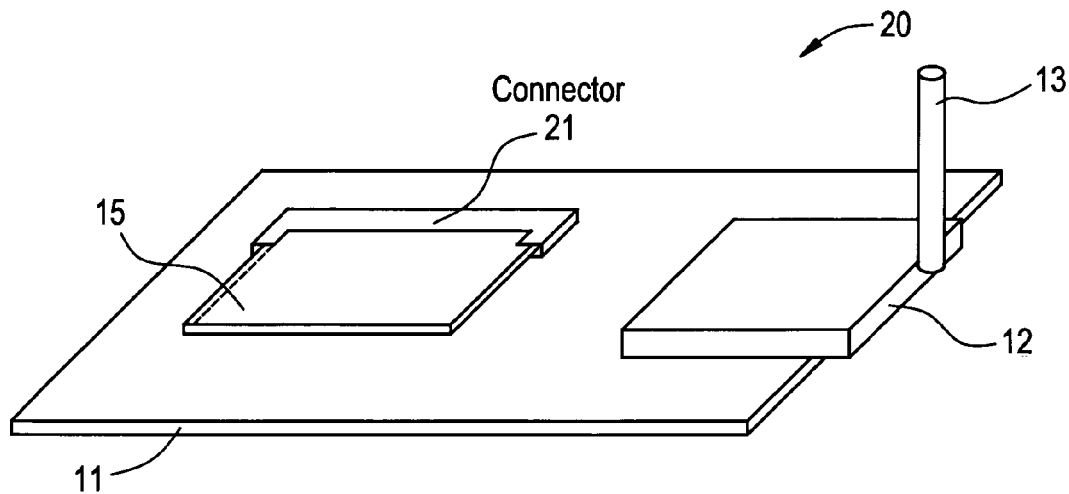
FIG. 2 is a perspective view illustrating the internal structure of a second exemplary conventional data processing terminal.
Figure 3:
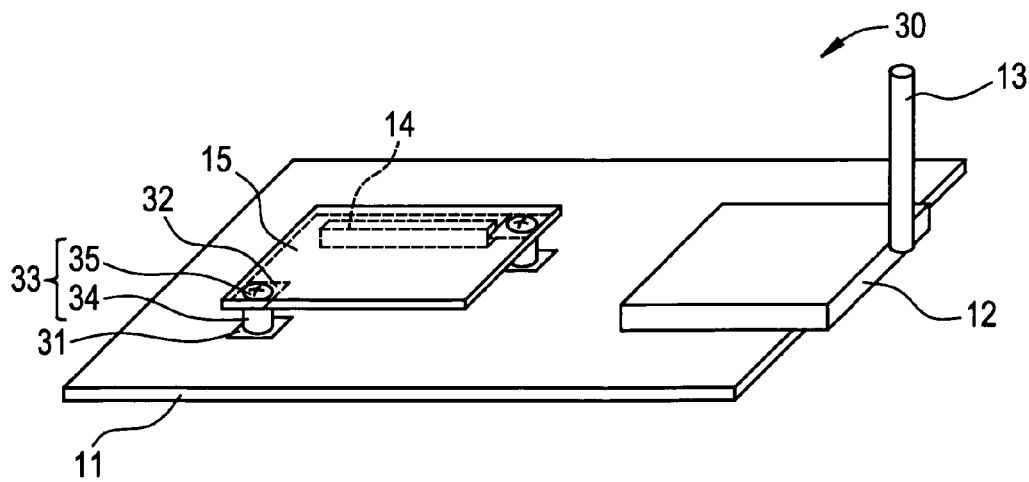
FIG. 3 is a perspective view illustrating the internal structure of a third exemplary conventional data processing terminal.
Figure 6:
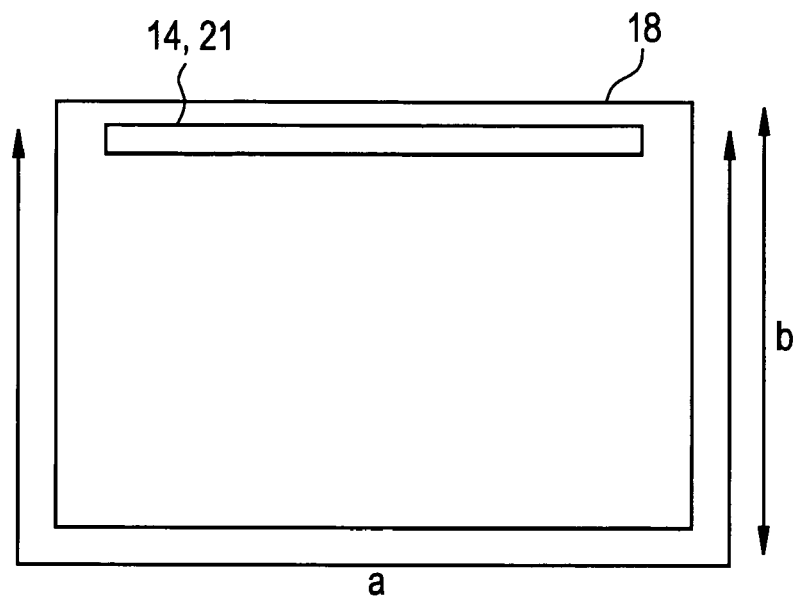
FIG. 6 is a top plan view illustrating a layout pattern for a connector on the second ground plane of the first and second exemplary conventional data processing terminals.

A first embodiment of the present invention will hereinafter be described with reference to FIGS. 8 to 13. However, parts in the following embodiments identical to those in the aforementioned prior art examples are designated the same names and reference numerals, and detailed description thereon will be omitted.

Figure 8:
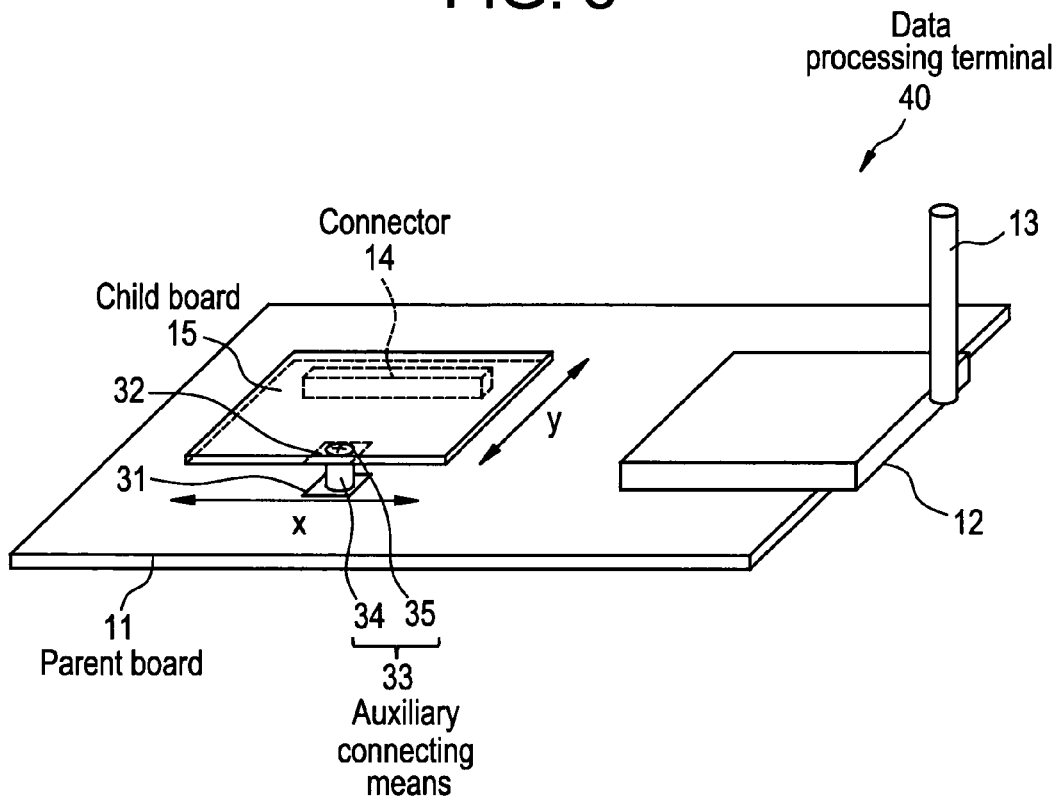
FIG. 8 is a perspective view illustrating the internal structure of a data processing terminal according to a first embodiment of the present invention.
Figure 9:
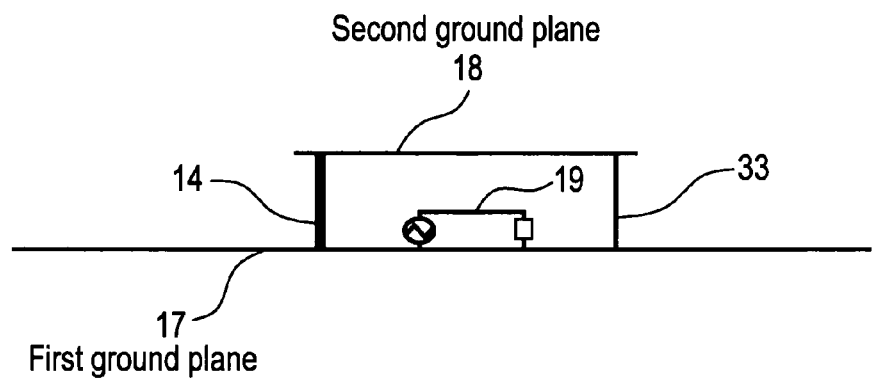

First, data processing terminal 40 according to this embodiment comprises a variety of data processing circuits 19 mounted on large rectangular parent board 11, as is the case with the aforementioned data processing terminals 10, 20, 30 as first to third prior art examples, as illustrated in FIGS. 8 and 9, wherein radio communication unit 12 in wired communication with data processing circuit 19 makes radio communications with the outside at a frequency band near 1.9 (GHz).

Also, parent board 11 comprises smaller rectangular child board 15 removably mounted thereon by connector 14 of a ground connecting means. Second ground plane 18 of child board 15 is connected to first ground plane 17 of parent board 11 through connector 14.

First ground plane 17 and second ground plane 18 thus electrically and mechanically connected through connector 14 and placed in parallel with each other are further electrically and mechanically connected by auxiliary connecting means 33 of the ground connecting means. In auxiliary connecting means 33, ground terminals 31, 32 of main/child boards 11, 15, which are electrically continuous to first ground plane/plane 17, 18, are in electrical communication through metal post 34 and screw 35.

Figure 10:
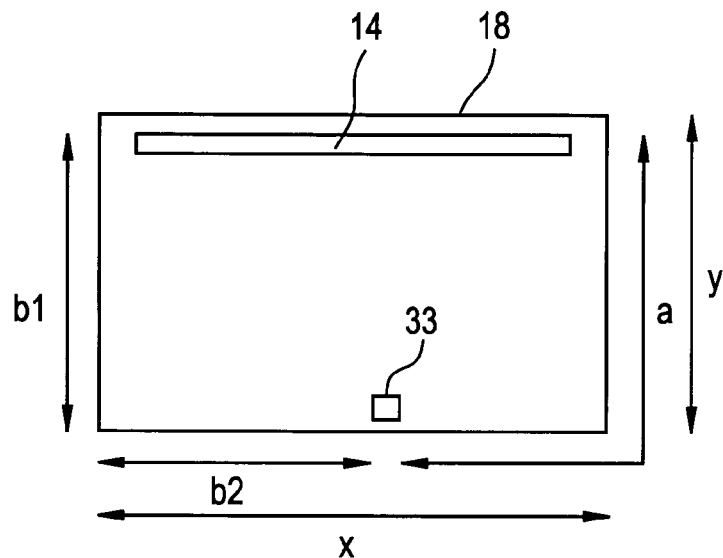
FIG. 10 is a top plan view illustrating a layout pattern for a connector and an auxiliary connecting means on the second ground plane.

However, in data processing terminal 40 of this embodiment, though connector 14 is positioned near one longer side of rectangular child board 15 in parallel therewith as illustrated in FIGS. 8 and 10, it differs from the aforementioned data processing terminal 30 and the like in that point-like auxiliary connecting means 33 is positioned near the center of the other longer side of child board 15.

In this embodiment, radio communication unit 12 makes radio communications in a frequency band near 1.9 (GHz) as mentioned above, so that its communication wavelength $\lambda$ is approximately 159 (mm). On the other hand, rectangular ground plane 18 has longer side x of 40 (mm) and shorter side y of 25 (mm). Also, in this embodiment, a design safety factor $\alpha$ is set to "1.5".

Thus, as illustrated in FIG. 9, in data processing terminal 40 of this embodiment, distance a between one end of connector 14 and auxiliary connecting means 33, which is the longest distance between a plurality of ground connecting means along continuous edges of second ground plane 18 is calculated as "a=y+x/2=45 (mm)", so that "$a<\lambda/2\alpha$" is satisfied because "45<159/2×1.5=53 (mm)".

Simultaneously, distance b1 from a corner of second ground plane 18 to one end of connector 14, which is the longest distance b from a corner on one edge of second ground plane 18 to the ground connecting means, is "b1=y=25 (mm)", so that "$b1<\lambda/4\alpha$" is satisfied because "25<159/4×1.5=26.5 (mm)".

In data processing terminal 40 of this embodiment, when one end of connector 14 is positioned near a corner of second ground plane 18 as mentioned above, this position is approximated to the corner of second ground plane 18, and when auxiliary connecting means 33 is positioned near an edge of second ground plane 18, this position is approximated to the edge of second ground plane 18.

In the configuration as described above, in data processing terminal 40 of this embodiment, data processing circuit 19 on parent board 11 generates an electromagnetic field through execution of data processing when radio communication unit 12 makes radio communications, so that the ground structure comprised of first and second ground planes 17, 18 connected by ground terminals of connector 14 acts as a resonant antenna.

However, the longest distance a from one end of connector 14 to auxiliary connecting means 33 along the continuous edge of second ground plane 18 satisfies "$a<\lambda/2\alpha$", and the longest distance b1 from the corner on one edge of second ground plane 18 to one end of connector 14 satisfies "$b1<\lambda/4\alpha$."

Consequently, since the resonant frequency of the aforementioned ground structure, which acts as a resonant antenna, is sufficiently higher than a communication frequency of the radio communication circuit, data processing terminal 40 of this embodiment can prevent radio communication unit 12 from impeding radio communications, and can satisfactorily carry out the radio communications.

Moreover, in data processing terminal 40 of this embodiment, connector 14 is identical in position and structure to its conventional counterpart with the addition of single extra auxiliary connecting means 33, so that it is also simple in structure and easy to assemble. Further, since auxiliary connecting means 33 is positioned near the center of the distal longer side of child board 15 from connector 14, child board 15 can also be mechanically held in a simple structure in a satisfactory manner.

Figure 11:
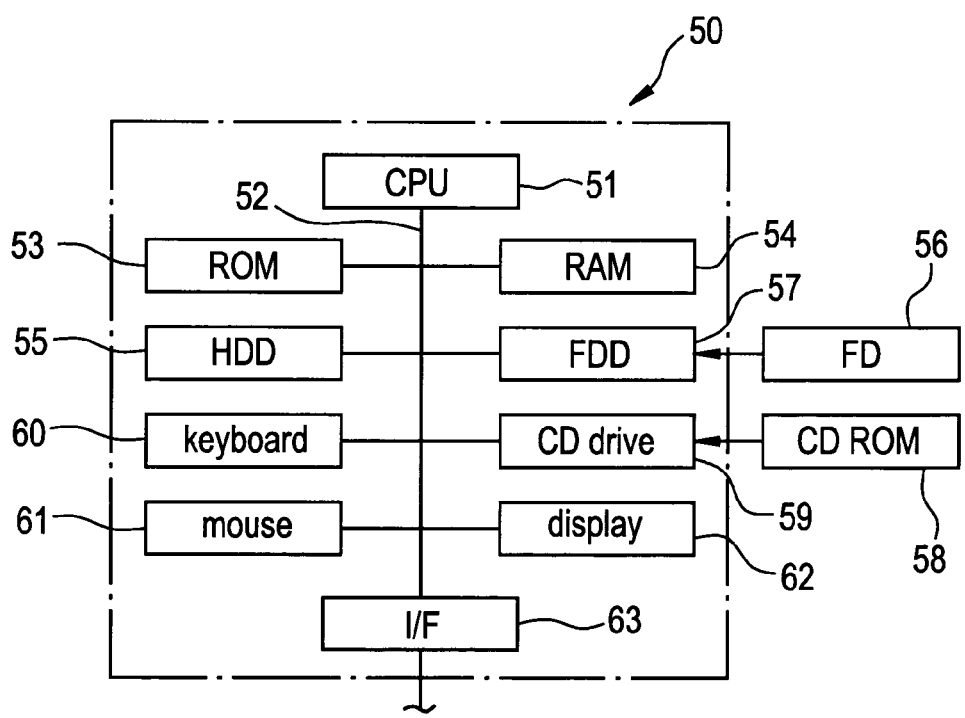
FIG. 11 is a block diagram illustrating the physical configuration of a terminal designing apparatus according to one embodiment of the present invention.

Here, the following description will be made on terminal designing apparatus 50 in this embodiment which is utilized for designing data processing terminal 40 in the structure as described above. As illustrated in FIG. 11, terminal designing apparatus 50 of this embodiment comprises CPU 51 as main hardware of a computer. CPU 51 is connected through bus line 52 to hardware such as ROM 53; RAM 54; HDD 55; FDD (FD Drive) 57 which is exchangeably loaded with FD 56; CD drive 59 which is exchangeably loaded with CD-ROM 58; keyboard 60; mouse 61; display 62; I/F unit 63, and the like.

In terminal designing apparatus 50 of this embodiment, hardware such as ROM 53, RAM 54, HDD 55, exchangeable FD 56, exchangeable CD-ROM 58, and the like correspond to information storage media, and computer programs for CPU 51 and a variety of data are stored in at least one of them as software.

For example, a computer program which causes CPU 51 to execute a variety of processing operations has been previously stored on FD 56 or CD-ROM 58. Such software has been previously installed in HDD 55, copied to RAM 54 upon start of terminal designing apparatus 50, and read by CPU 51.

Figure 12:
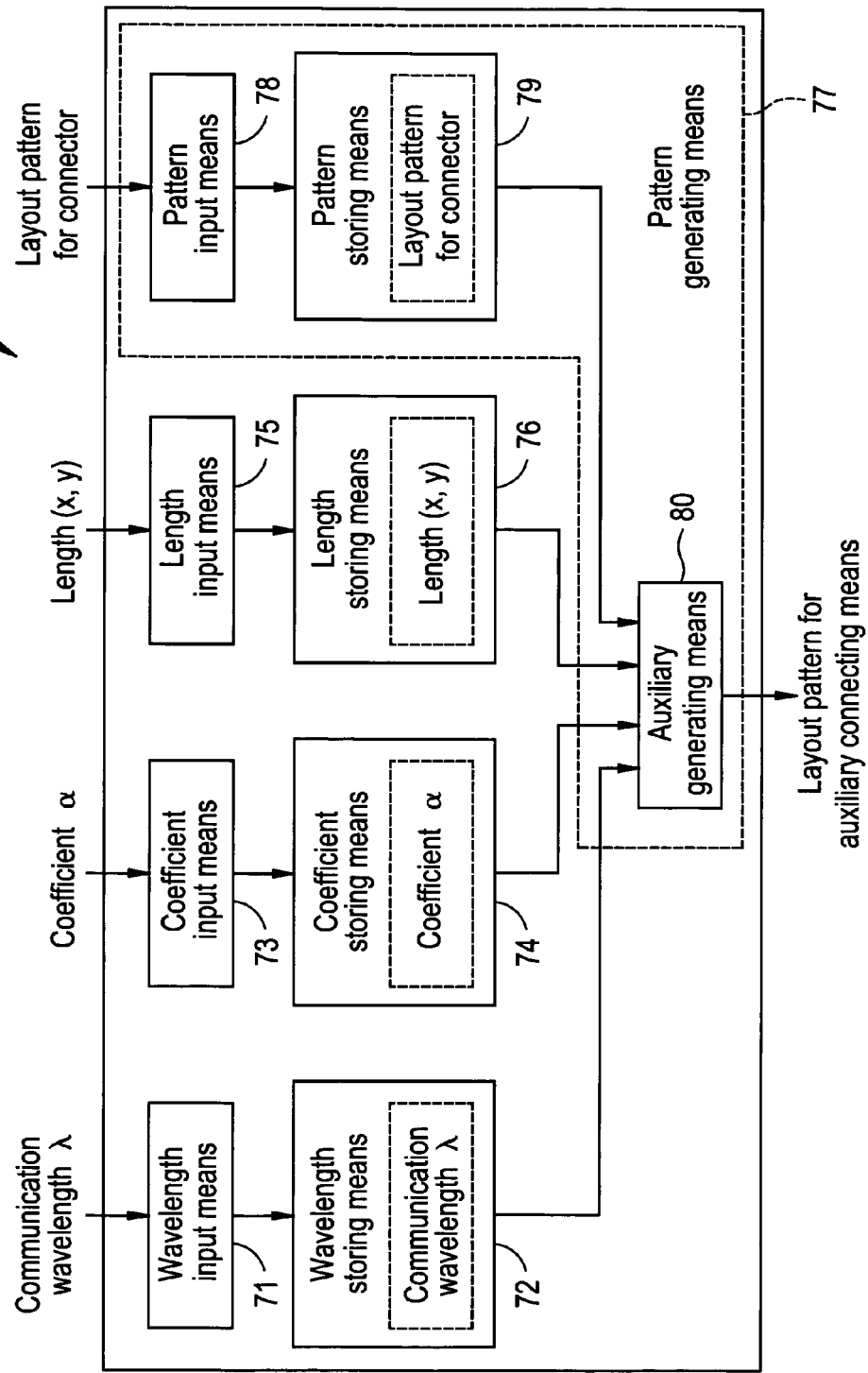
FIG. 12 is a schematic diagram illustrating the logical configuration of the terminal designing apparatus.

As CPU 51 reads a proper computer program to execute a variety of processing operations, terminal designing apparatus 50 of this embodiment logically comprises a variety of means such as wavelength input means 71, wavelength storing means 72, coefficient input means 73, coefficient storing means 74, length input means 75, length storing means 76, pattern generating means 77, or the like, as illustrated in FIG. 12. Pattern generating means 77 comprises pattern input means 78, pattern storing means 79, and auxiliary generating means 80.

Wavelength input means 71, which represents a function of CPU 51 for recognizing data entered through keyboard 60, and the like in accordance with a computer program stored in RAM 54, receives communication wavelength $\lambda$ of radio communication unit 12 in data processing terminal 40 which is to be designed. Wavelength storing means 72, which represents a storage area or the like built in HDD 55 for CPU 51 to recognize data in accordance with the computer program, stores entered communication wavelength $\lambda$.

Likewise, coefficient input means 73, which represents a function of CPU 51 for recognizing data entered through keyboard 60, or the like in accordance with a computer program, receives safety coefficient $\alpha$ equal to or larger than "1". Coefficient storing means 74, which also represents a storage area or the like built in HDD 55 for CPU 51 to recognize data in accordance with a computer program, stores entered coefficient $\alpha$.

Similarly in the following, length input means 74 receives lengths x, y of two orthogonal edges of second ground plane 18, and length storing means 76 stores two entered lengths x, y. Pattern input means 78 receives a layout pattern for connector 14 which is parallel with one edge of second ground plane 18, and pattern storing means 79 stores the entered layout pattern for connector 14.

Then, auxiliary generating means 80, which represents a function of CPU 51 for executing predetermined data processing in accordance with a computer program, or the like, generates a layout pattern for auxiliary connecting means 44 based on data stored in the aforementioned respective storing means 72, 74, 76, 79.

In this event, as terminal designing apparatus 50 executes data processing in accordance with a predetermined algorithm, a layout pattern for auxiliary connecting means 33 is generated such that the longest distance a between one end of connector 14 and auxiliary connecting means 33 along the continuous edges of second ground plane 18 satisfies "$a<\lambda/2\alpha$", and such that the longest distance b from a corner on one edge of second ground plane 18 to one end of connector 14 satisfies "$b1<\lambda/4\alpha$".

While a variety of means as mentioned above are implemented as required by hardware such as keyboard 60, display 62, and the like, their nucleuses are implemented by CPU 51, hardware of terminal designing apparatus 50, which functions in accordance with software stored in information storage media such as RAM 54 and the like.

Such software is stored in information storage media such as RAM 54 and the like as a computer program for causing CPU 51 and the like to execute such processing operations as receiving communication wavelength λ entered through keyboard 60 or the like; storing entered communication wavelength λ in HDD 55 or the like; storing entered coefficient α, storing two entered length x, y, storing an entered layout pattern for connector 14 in a similar manner; generating a layout pattern for auxiliary connecting means 33 based on a variety of stored data; and the like, by way of example.

In the configuration as described above, terminal designing apparatus 50 of this embodiment can generate a layout for auxiliary connecting means 33 in data processing terminal 40 for which communication wavelength λ, shape of second ground plane 18, and layout for connector 14 have been determined.

Figure 13:
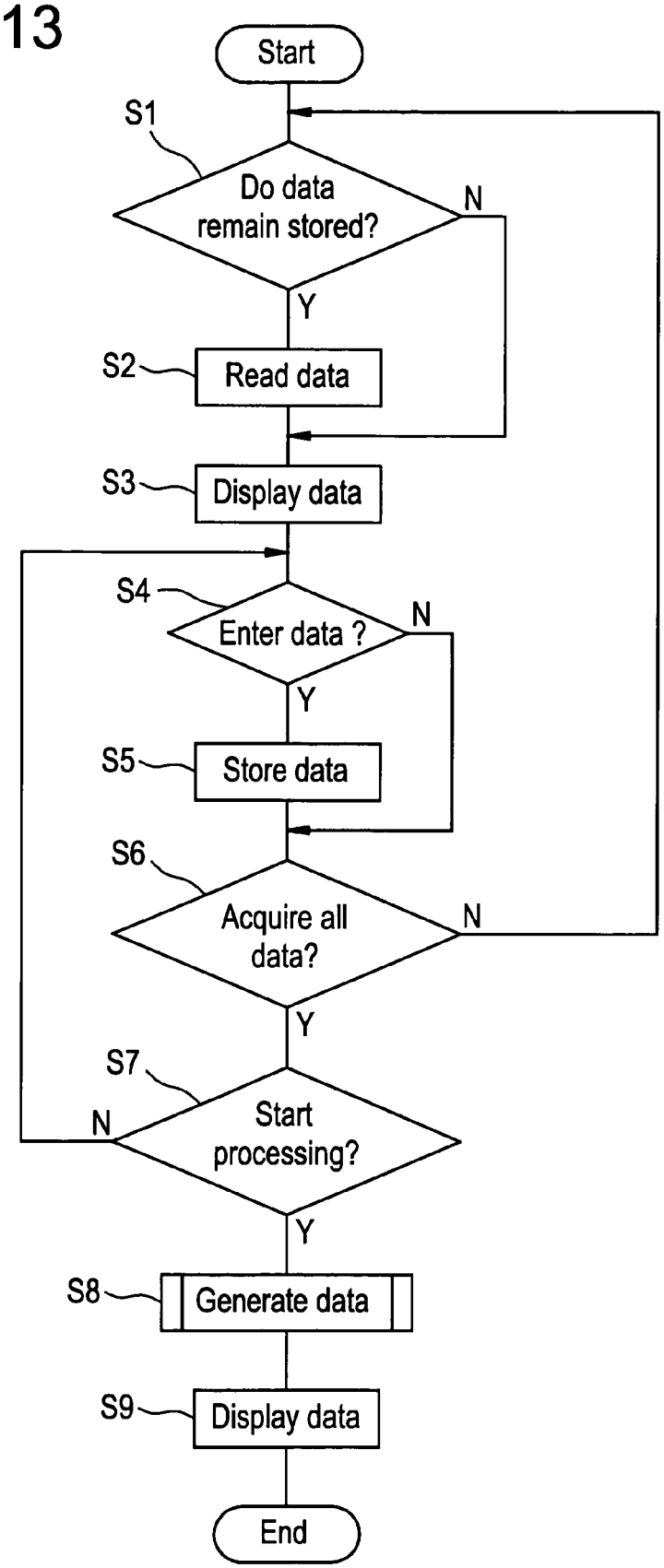
FIG. 13 is a flow chart illustrating a terminal designing method for the terminal designing apparatus.
Figure 14:
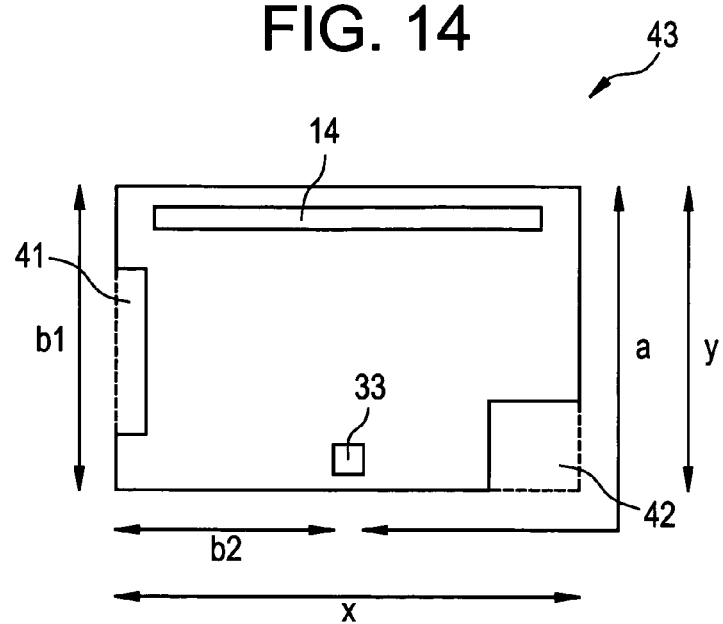
FIG. 14 is a top plan view illustrating the second ground plane in an exemplary modification.

In this event, as illustrated in FIG. 13, terminal designing apparatus 50 displays on display 62 a guidance text such as "enter following data" together with items to be entered such as "communication wavelength λ=(mm), safety coefficient α=, longer side x of second ground plane=(mm), shorter side y=(mm), . . . " and the like (step S3).

Thus, as an operator (not shown) who designs data processing terminal 40 enters desired numerical data for the aforementioned items to be entered through keyboard 60 or the like, terminal designing apparatus 50 stores the entered numerical data (steps S4, S5).

The numerical data thus entered are displayed at respective positions of the items to be entered. When numerical data have been previously entered and remain stored (step S1), the numerical data are displayed at the positions of associated items to be entered as changeable default values (steps S2, S3). The layout pattern for connector 14 is entered, for example, as numerical data on xy-coordinates at both ends of connector 14 when the origin is defined at one of four corners of second ground plane 18.

Then, as terminal designing apparatus 50 of this embodiment receives an instruction to start the processing after storing all of communication wavelength λ, safety coefficient α, longer side x and shorter side y of second ground plane 18, and the layout pattern for connector 14 (step S6, S7), terminal designing apparatus 50 generates a layout pattern for auxiliary connecting means 33 based on the stored data in accordance with a predetermined algorithm (step S8).

While a variety of algorithms may be supposed for generating the layout pattern for auxiliary connecting means 33, shortest distance aM, which is maximum distance a, is calculated as "$aM=\lambda/2\alpha$", while length L of the edge of second ground plane 18 continuous from one end to the other end of connector 14 is calculated as "$L=x+2y$".

Next, length L is divided by maximum distance aM to provide an integer portion of the result as a candidate for the quantity of auxiliary connecting means 33, and to provide the sum of "1" and the integer portion as a candidate for the number of division. Next, length L is divided by this candidate number of division to detect candidate places for auxiliary connecting means 33. Then, it is confirmed whether or not "$b1<\lambda/4\alpha$" is satisfied when auxiliary connecting means 33 are disposed at those places.

Since data processing terminal 40 described above has maximum distance aM equal to "$\lambda/2\alpha=53$ (mm)" and length L equal to "$x=2y=90$ (mm)", the candidate for the quantity of auxiliary connecting means 53 is "1", while the candidate for the number of division is "2". Consequently, the candidate place for auxiliary connecting means 33 is at 45 (mm) from both ends of connector 14. This is the center of the longer side opposite to connector 14.

When distances b1, b2 are calculated, as illustrated in FIG. 10, with auxiliary connecting means 33 disposed in this way, it is confirmed that both of them satisfy "$b<\lambda/4\alpha$". If it is confirmed that they do not satisfy "$b<\lambda/4\alpha$", for example, if the candidate for the quantity of auxiliary connecting means 33 is "1", "1" is added to the candidate, length L is equally divided by the resulting number, and then, candidate places are again detected for auxiliary connecting means 33.

If the candidate for the quantity of auxiliary connecting means 33 which does not satisfy "$b<\lambda/4\alpha$", is plural, candidate places for auxiliary connecting means 33 are displaced to places at which "$b<\lambda/4\alpha$" is satisfied, and a confirmation is made at those places as to whether or not "$a<\lambda/2\alpha$" is satisfied. If "$a<\lambda/2\alpha$" is not satisfied even in this event, "1" is added to the candidate for the quantity of auxiliary connecting means 33 to again detect candidate places, followed by repetitions of similar processing operations.

The layout pattern for auxiliary connecting means 33 generated as described above is displayed on display 62, for example, as numerical data on the coordinates and image data of a figure (step S9), thus permitting the operator to confirm the generated layout pattern for auxiliary connecting means 33.

In the layout pattern generated by terminal designing apparatus 50 in this way, longest distance a between one end of connector 14 and auxiliary connecting means 33 along the continuous edges of second ground plane 18 satisfies "$a<\lambda/2\alpha$", and the longest distance b from a corner on one edge of second ground plane 18 to auxiliary connecting means 33 satisfies "$b<\lambda/4\alpha$" so that data processing terminal 40, which is designed in accordance with the layout pattern, can satisfactorily carry out radio communications.

The present invention is not limited to the embodiment described above, but contemplates a variety of modifications without departing from the gist thereof. For example, while the foregoing embodiment has illustrated that terminal designing apparatus 50 generates a layout pattern for auxiliary connecting means 33 based on a variety of data which involves a layout pattern for connector 14, it is also possible to generate a layout pattern for connector 14 and auxiliary connecting means 33 based on a variety of data which does not involve a layout pattern for connector 14.

Further, while the foregoing embodiment has illustrated that terminal designing apparatus 50 generates a layout pattern for auxiliary connecting means 33 based on a variety of data entered thereinto, a terminal designing apparatus (not shown) can also confirm based on a variety of data which involves a layout pattern for connector 14 and auxiliary connecting means 33, for example, whether or not the layout pattern satisfies "a<λ/2α" and "b<λ/4α."

Further, terminal designing apparatus 50 in the foregoing embodiment has illustrated that a variety of means are logically implemented as a variety of functions of terminal designing apparatus 50 by CPU 51 which operates in accordance with computer programs stored in RAM 54 and the like. However, each of a variety of such means can be formed as dedicated hardware, or some can be stored in RAM 54 and the like as software while some is formed as hardware.

Figure 7:
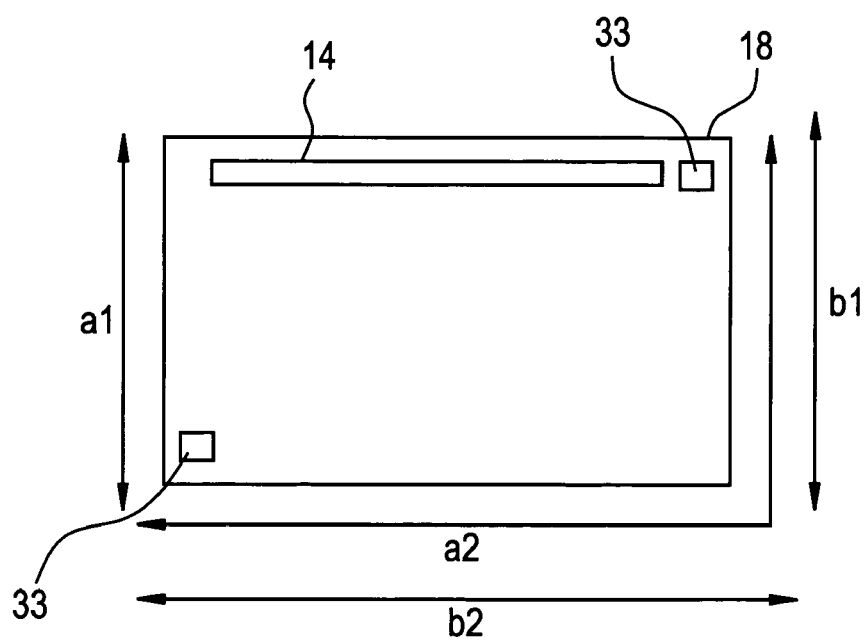
FIG. 7 is a top plane view of a layout pattern for a connector and auxiliary connecting means on a second ground plane of a third exemplary conventional data processing terminal.

Also, the foregoing embodiment has illustrated that child board 15 has the edges formed in exactly linear fashion and the corners formed at exactly right angles. However, even if an edge or a corner of a rectangle is formed with recesses 41, 42, for example, as illustrated in FIG. 7, the irregularly shaped edge can be approximated to a linear edge, and the irregularly shaped corner can be approximated to a corner having a right angle as well. Further, while the foregoing embodiment has illustrated that linear connector 41 is positioned in parallel with a longer side of child board 15, this may be positioned in parallel with a shorter side of the same.

Also, while the foregoing embodiment has illustrated that radio communication unit 12 is removably mounted in data processing terminal, radio communication unit 12 can be integrally secured thereon, radio communication unit 12 can be connected through a connection cable (not shown), or separate radio communication unit 12 can be used in the neighborhood without being connected thereto, by way of example.

Likewise, while the foregoing embodiment has illustrated that child board 15 is removably mounted on parent board 11, this can be integrally secured thereon. Also, while the foregoing embodiment has illustrated that child board 15 and radio communication unit 12 are disposed on the same side of parent board 11, child board 15 can be positioned on the frond side of parent board 11, while radio communication unit 12 can be positioned on the back side of parent board 11, by way of example.

Further, while data processing terminal 40 in the foregoing embodiment has illustrated that data processing circuit 19 is mounted on parent board 11 to which child board 15 is connected, data processing circuit 19 can be mounted only on child board 15, or can be distributively mounted on both parent board 11 and child board 15. When data processing circuit 19 is mounted only on child board 15 as mentioned above, parent board 11 is not needed as a circuit board, so that first ground plane 17, which has a large area and a large capacity, is preferably formed as an independent member.

Also, while the foregoing embodiment has illustrated that data processing terminal 40 is formed for portable applications, this can also be formed for stationary applications. Also, while the foregoing embodiment has illustrated that the communication frequency of radio communication unit 12 is near 1.9 (GHz) for PHS, this can be near 800 (MHz), 1.5 (GHz), or 2.0 (GHz) for portable telephones, or can be near 2.4 (GHz) for Bluetooth as well.

When the communication frequency is near 2.0 (GHz) for portable telephone, the communication wavelength is approximately 150 (mm) (λ≈150), so that it is preferred that distance b satisfies "b<38/α (mm)" and distance a satisfies "a<75/α (mm)". On the other hand, when the communication frequency is near 2.4 (GHz) for Bluetooth, λ≈125 (mm), so that it is preferred that distances b, a satisfy "b<31/α (mm)" and "a<63/α (mm)" respectively.

Further, while data processing terminal 40 in the foregoing embodiment has illustrated that point-like auxiliary connecting means 33 is positioned near the center of the edge opposite to connector 14, as the structure which satisfies "a<λ/2α" and "b<λ/4α" on child board 15, the aforementioned layout pattern can be modified in various manners, as a matter of course, and it is possible to realize a layout pattern in which distance a only exists but distance b does not exist.

Figure 15:
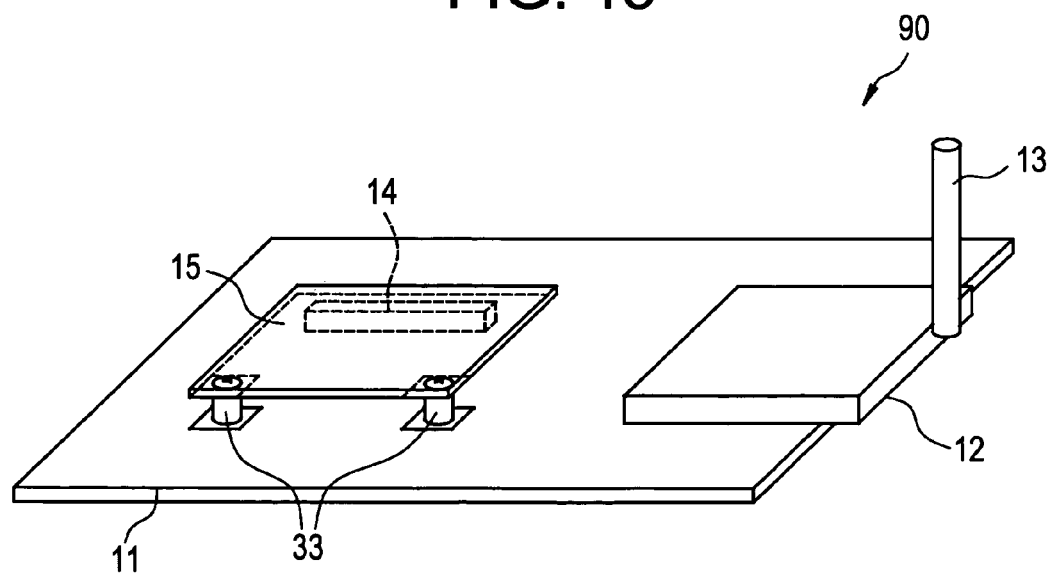
FIG. 15 is a perspective view illustrating the internal structure of the data processing terminal in a first exemplary modification to the first embodiment.
Figure 16:
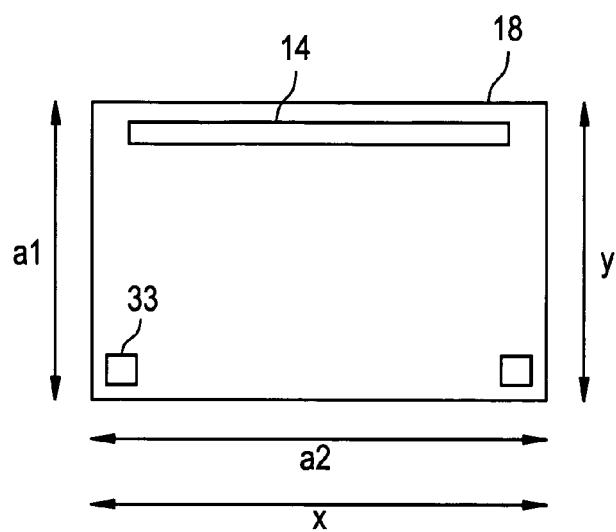
FIG. 16 is a top plan view illustrating a layout pattern of the connector and auxiliary connecting means on the second ground plane.

For example, in data processing terminal 90 which is illustrated in FIGS. 15 and 16 as a first exemplary modification to the foregoing embodiment, connector 14 is positioned near one longer side of rectangular child board 15, and two auxiliary connecting means 33 are positioned one by one at corners on both sides of the other longer side.

In data processing terminal 90, the longest distance between a plurality of ground connecting means along the continuous edges of second ground plane 18 is distance a2 between two auxiliary connecting means 33, but no distance b exists because the ground connecting means are positioned at all of four corners of second ground plane 18. More specifically, in data processing terminal 90, distance a2 between two auxiliary connecting means 33 is expressed by "a2=x=40 (mm)" so that "a<λ/2α" is satisfied because "40<53 (mm)".

Figure 17:
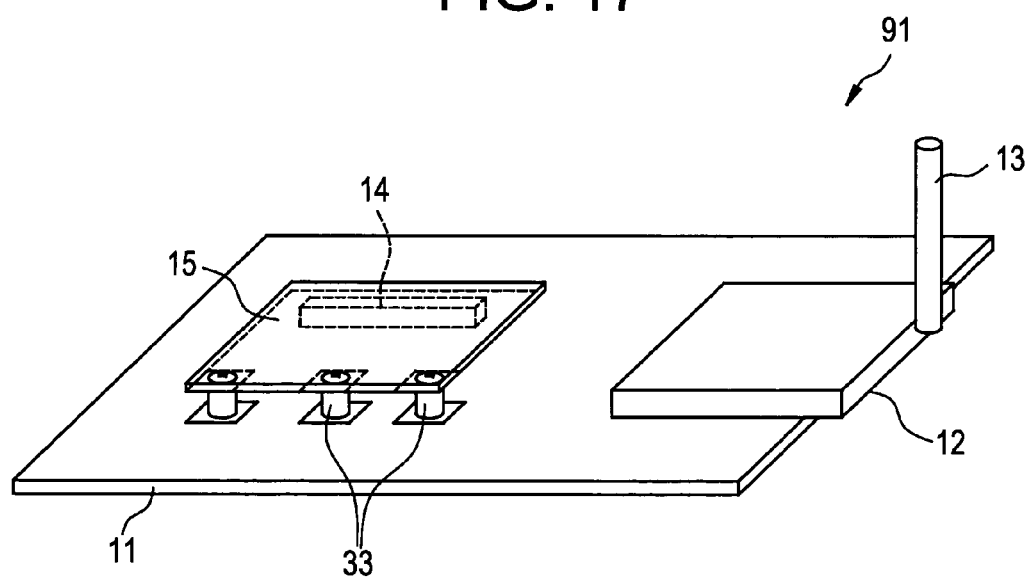
FIG. 17 is a perspective view illustrating the internal structure of the data processing terminal in a second exemplary modification.
Figure 18:
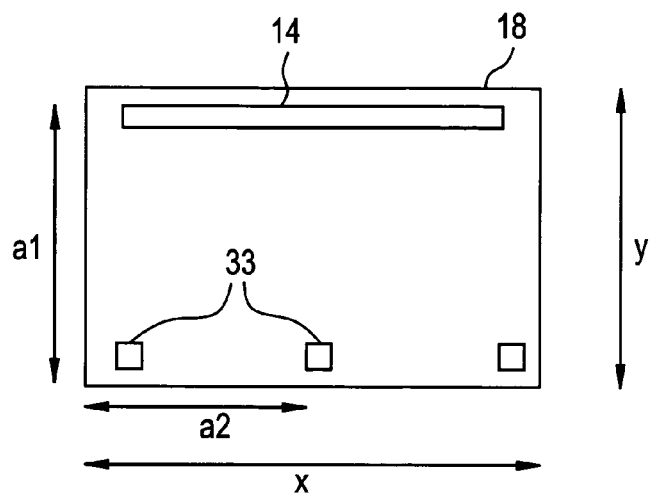
FIG. 18 is a top plan view illustrating a layout pattern for the connector and auxiliary connecting means on the second ground plane.

Also, in data processing terminal 91 illustrated in FIGS. 17 and 18 as a second exemplary modification, three auxiliary connecting means 33 are positioned one by one at corners and center of the longer side of rectangular child board 15 opposite to connector 14. In data processing terminal 91, the longest distance between a plurality of ground connecting means along the continuous edges of second ground plane 18 is distance a1 between one end of connector 14 and auxiliary connecting means 33 at the corner. Since this distance a1 is expressed by "a1=y=25 (mm)", "a<λ/2α" is satisfied.

Figure 19:
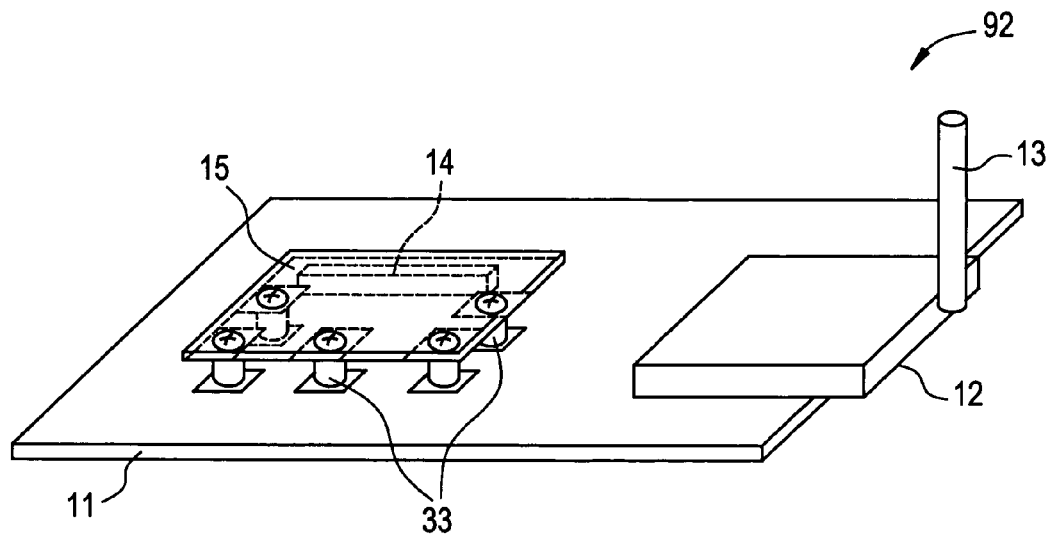
FIG. 19 is a perspective view illustrating the internal structure of the data processing terminal in a third exemplary modification.

Further, in data processing terminal 92 illustrated in FIGS. 19 and 20 as a third exemplary modification, one each of auxiliary connecting means 33 is positioned at the center of each of two shorter sides of rectangular child board 15. In data processing terminal 92, since the longest distance between a plurality of ground connecting means along the continuous edges of second ground plane 18 is distance a2 between auxiliary connecting means 33 at the corner and center of the longer side, and "a<λ/2α" is satisfied because distance a2 is expressed by "a2=x/2=20 (mm)".

Figure 21A:
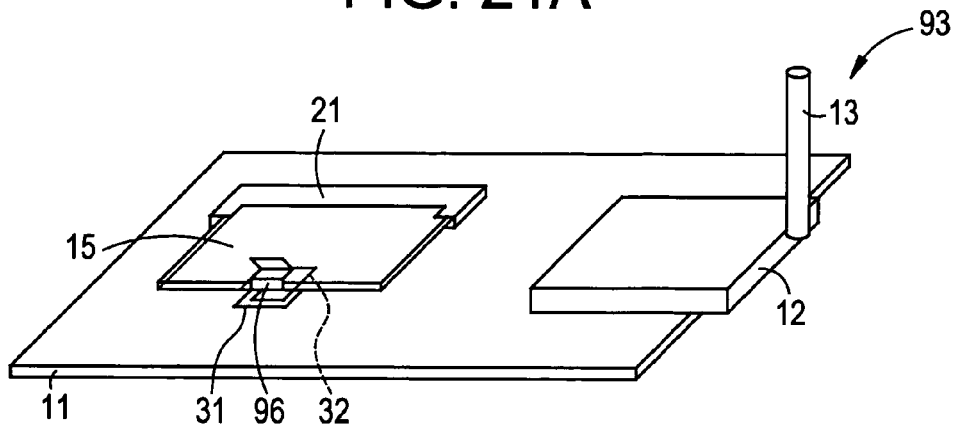
FIG. 21A is a perspective view illustrating the internal structure of the data processing terminal in a fourth exemplary modification.
Figure 21B:
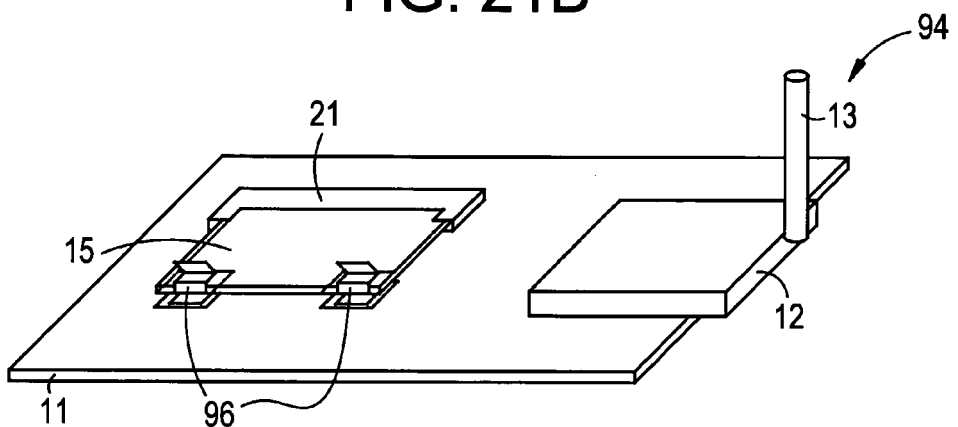
FIG. 21B is a perspective view illustrating the internal structure of the data processing terminal in a fifth exemplary modification.
Figure 21C:
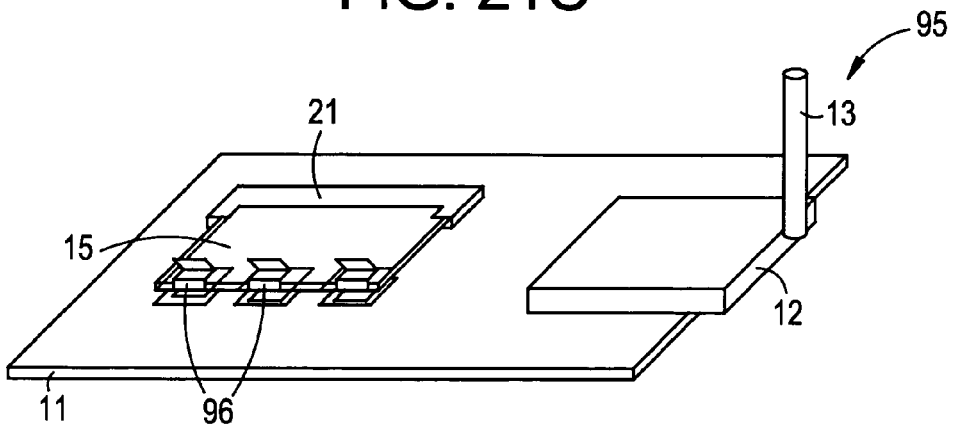
FIG. 21C is a perspective view illustrating the internal structure of the data processing terminal in a sixth exemplary modification.

Also, while data processing terminal 40 and the like in the foregoing embodiment have illustrated that the connector comprises a pair of vertically removable connectors 14, and auxiliary connecting means 33 is composed of metal post 34 and screw 35. However, as data processing terminals 93–95 illustrated in FIGS. 21A, 21B, and 21C as fourth to sixth exemplary modifications, the connector can also comprise connector 21 which is attached to and removed from child board near one edge thereof in the transverse direction, and the auxiliary connecting means can also be formed by spring member 96 which is bent in a predetermined shape for holding another edge of child board 15.

Figure 22:
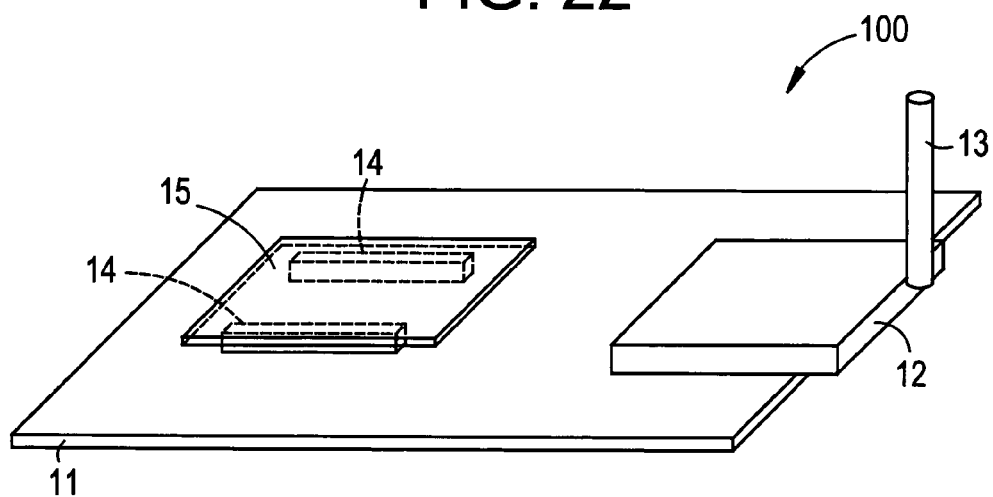
FIG. 22 is a perspective view illustrating the internal structure of a data processing terminal according to a second embodiment.
Figure 23:
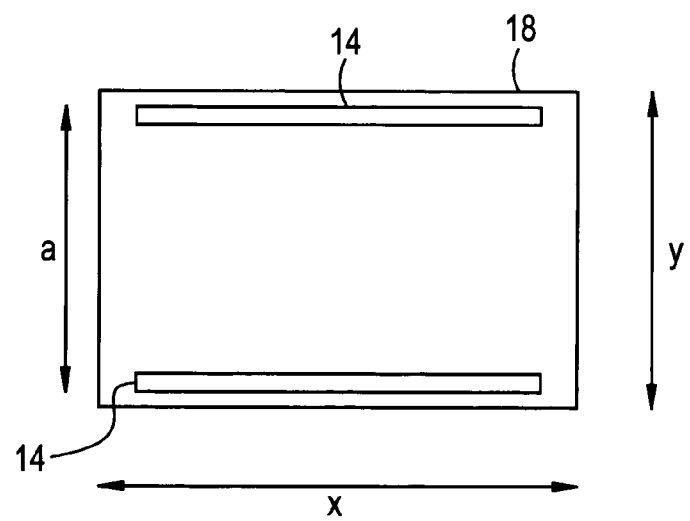
FIG. 23 is a top plan view illustrating a layout pattern for two connectors which comprise a connector and an auxiliary connecting means on the second ground plane.

Next, a second embodiment of the present invention will be described below with reference to FIGS. 22 and 23. First, data processing terminal 100 of this embodiment comprises a connector which is connector 14 disposed in parallel with one longer side of child board 15, and an auxiliary connecting means which is connector 14 disposed in parallel with the other longer side of child board 15.

In data processing terminal 100 of this embodiment, connector 14 disposed along the one longer side of child board 15 connects data processing circuit 19 of parent board 15 to a memory circuit on child board 15, as well as connects first ground plane 17 to second ground plane 18.

However, connector 14 disposed along the other longer side of child board 15 as the auxiliary connecting means does not connect data processing circuit 19 on parent board 11 to the memory circuit on child board 15, but connects first ground plane 17 to second ground plane 18.

In the configuration as described above, in data processing terminal 100 of this embodiment, distance a between ends of the pair of connector 14, which is the longest distance between a plurality of ground connecting means along the continuous edges of second ground plane 18 is expressed by "a=y=25 (mm)", so that "a<λ/2α" is satisfied because "25<53 (mm)".

The foregoing embodiment has illustrated that connector 14 of the connector alone connects data processing circuit 19 on parent board to the memory circuit on child board 15, whereas connector 14 of the auxiliary connecting means does not connect data processing circuit 19 to the memory circuit.

However, both of the pair of connectors 14, disposed one by one on both longer sides of child board 15 as the connector and auxiliary connecting means, can also connect data processing circuit 19 on parent board 11 to the memory circuit on child board 15 as well as connect first ground plane 17 to second ground plane 18.

Figure 24:
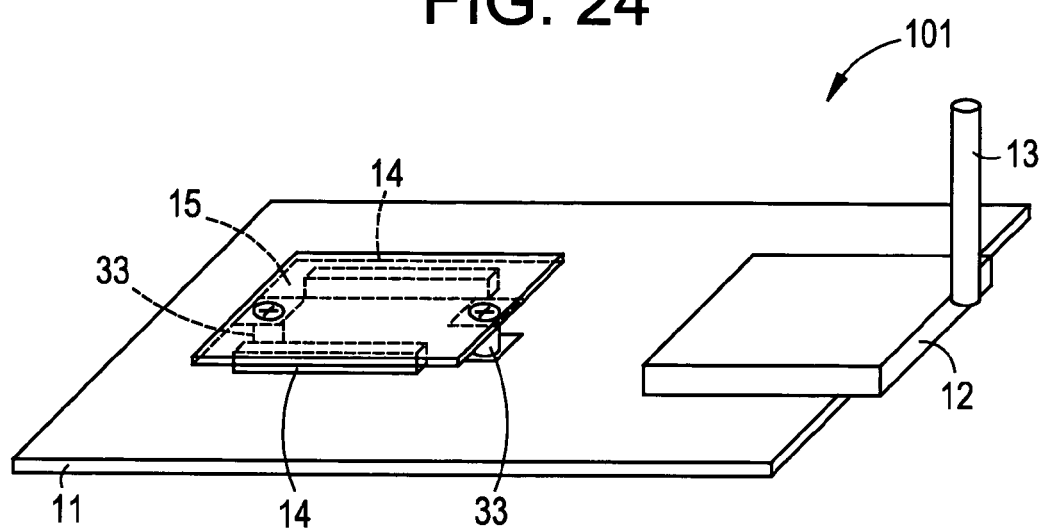
FIG. 24 is a perspective view illustrating the internal structure of the data processing terminal in a first exemplary modification to the second embodiment.
Figure 25:
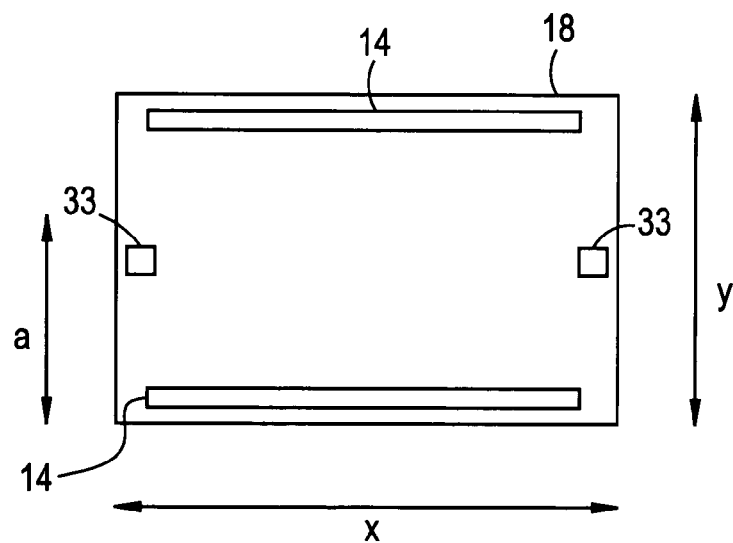
FIG. 25 is a top plan view illustrating a layout for connectors and auxiliary connecting means on the second ground plane.

Also, as data processing terminal 101 illustrated in FIGS. 24 and 25 as a first exemplary modification to the foregoing embodiment, two auxiliary connecting means 33 can also be positioned one by one at the centers of both shorter sides of child board 15. In data processing terminal 101, distance a between one end of connector 14 and auxiliary connecting means 33, which is the longest distance between a plurality of ground connecting means along the continuous edges of second ground plane 18, is expressed by "a=y/2=12.5 (mm)", so that "a<λ/2α" is satisfied.

Figure 26A:
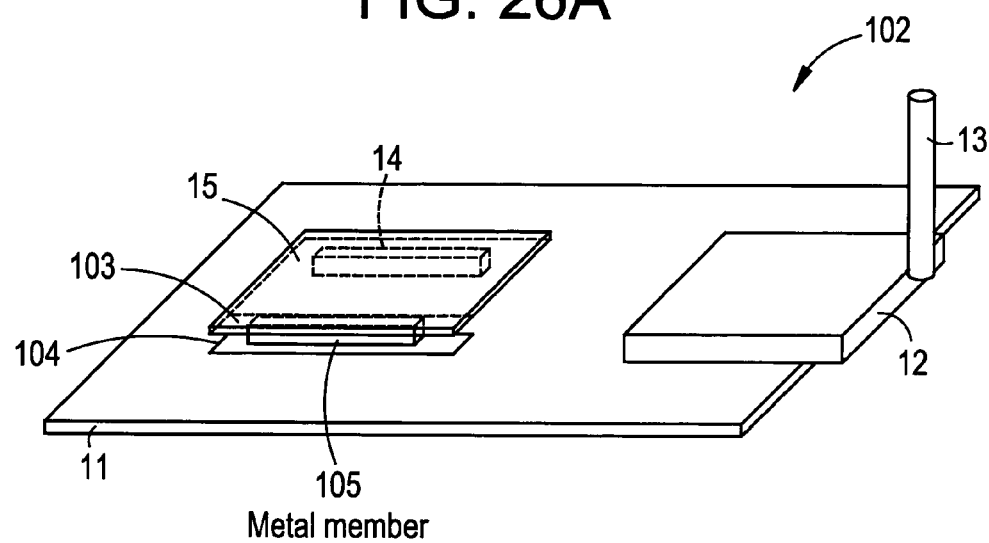
FIG. 26A is a perspective view illustrating the internal structure of the data processing terminal in a second exemplary modification.

Further, data processing terminal 100 and the like in the foregoing embodiment have illustrated that a pair of connectors 14 are disposed one by one along both longer sides of child board 15 as a connector and an auxiliary connecting means. However, as data processing terminal 102 illustrated in FIG. 26A as a second exemplary modification to the foregoing embodiment, the auxiliary connecting means can also be formed of linear metal member 105 for connecting linear ground terminals 103, 104 formed along a longer side of child board 15 and on parent board 11.

Figure 26B:
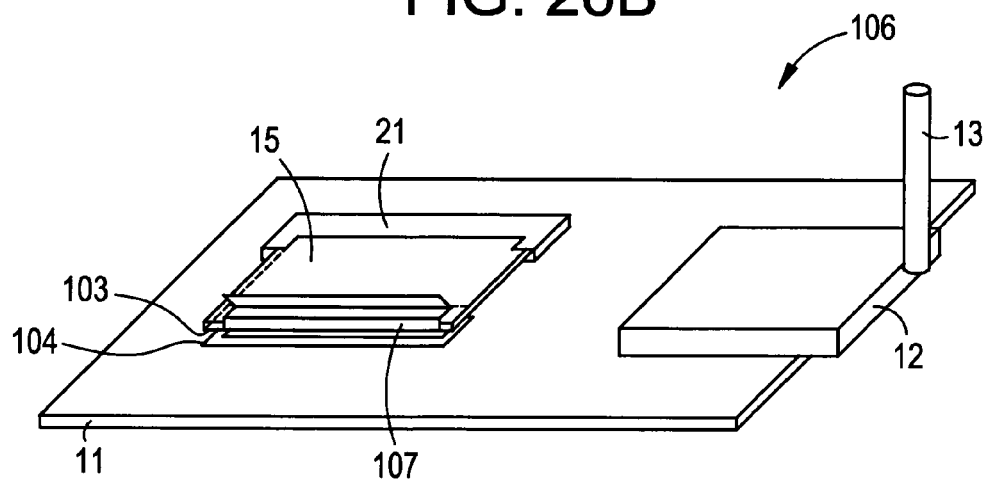
FIG. 26B is a perspective view illustrating the internal structure of the data processing terminal in a third exemplary modification.

Also, as data processing terminal 106 illustrated in FIG. 26B as a third exemplary modification to the foregoing embodiment, one edge of child board 15 can be formed with connector 21 which is attached to and removed from parent board 11 in the transverse direction, and the auxiliary connecting means can be formed of an oblong spring member 107 for connecting linear ground terminals 103, 104 of child board 15 and parent board 11.

Figure 27:
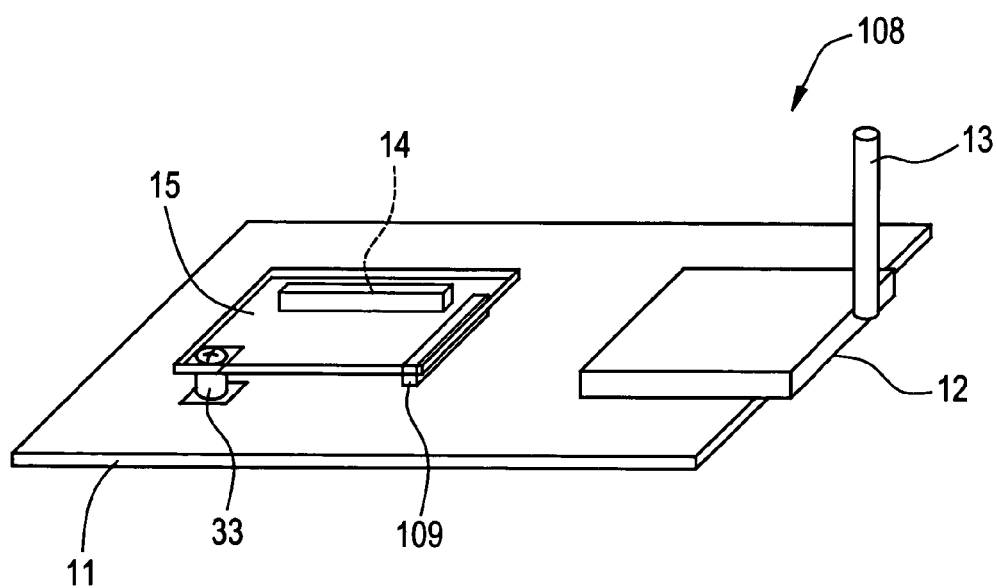
FIG. 27 is a perspective view illustrating the internal structure of a data processing terminal according to a third embodiment.
Figure 28:
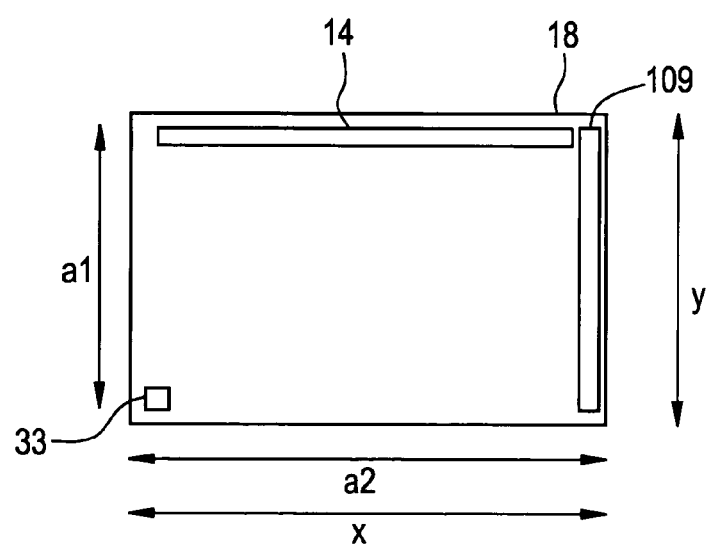
FIG. 28 is a top plan view illustrating a layout pattern for a connector and a first and a second auxiliary connecting means on the second ground plane.

Next, a third embodiment of the present invention will be described below with reference to FIGS. 27 and 28. First, in data processing terminal 108 of this embodiment, connector 14 is disposed in parallel with one longer side of child board 15, connector 109, which is a first auxiliary connecting means, is also disposed in parallel with one shorter side, and point-like second auxiliary connecting means 33 is disposed at a corner at which the two sides, along which connectors 14, 109 are not disposed, intersect with each other.

In the configuration as described above, in data processing terminal 108 of this embodiment, longest distance a2 between a plurality of ground connecting means along the continuous edges of second ground plane 18 is expressed by "a2=X=40 (mm)", so that "a<λ/2α" is satisfied because "40<53 (mm)".

Figure 29:
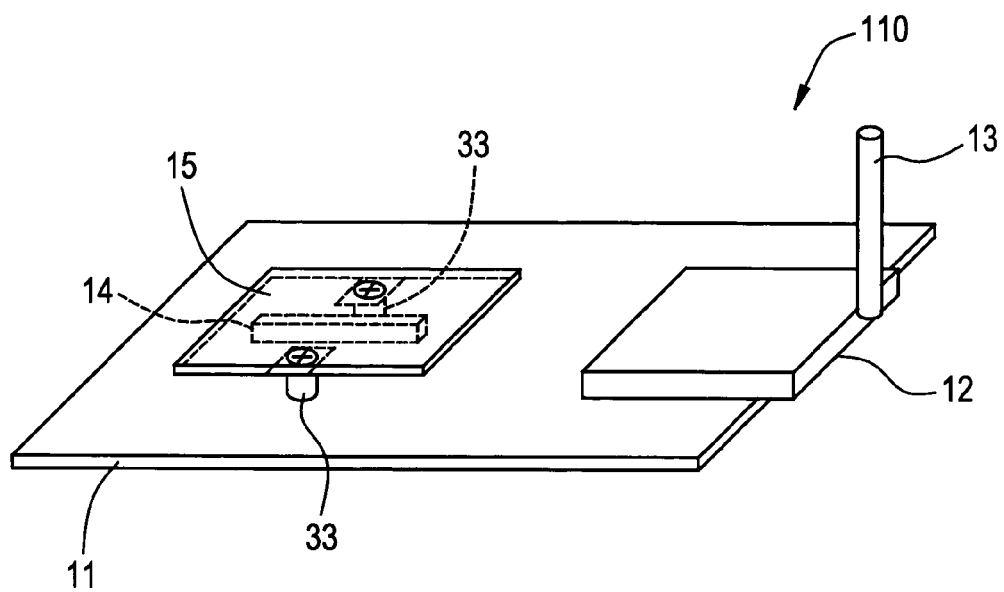
FIG. 29 is a perspective view illustrating the internal structure of a data processing terminal according to a fourth embodiment.
Figure 30:
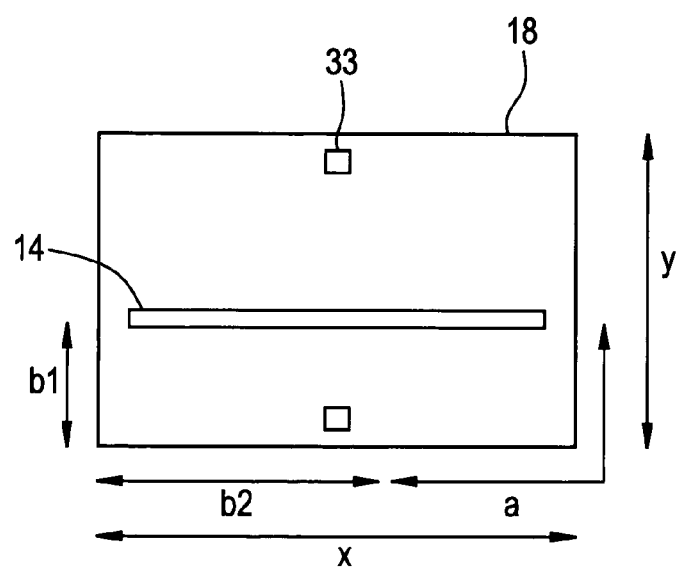
FIG. 30 is a top plan view illustrating a layout pattern for a connector and an auxiliary connecting means on the second ground plane.

Next, a fourth embodiment of the present invention will be described below with reference to FIGS. 29 and 30. In data processing terminal 110 of this embodiment, connector 14 is disposed halfway between a pair of longer sides of child board 15 in parallel therewith, and two point-like auxiliary connecting means 33 are disposed one by one at the center on each of the pair of longer sides of child board 15.

In the configuration as described above, in data processing terminal 110 of this embodiment, distance a between one end of connector 14 and auxiliary connecting means 33, which is the longest distance between a plurality of ground connecting means along the continuous edges of second ground plane 18, satisfies "a<λ/2α" because distance a is calculated as "a=x/2+y/2=32.5 (mm)", while distance b2 from a corner of second ground plane 18 to auxiliary connecting means 33, which is the longest distance b from a corner on one edge of second ground plane 18 to the ground connecting means, satisfies "b2<λ/4α" because distance b2 is calculated as "b2=x/2=20 (mm)".

Figure 31:
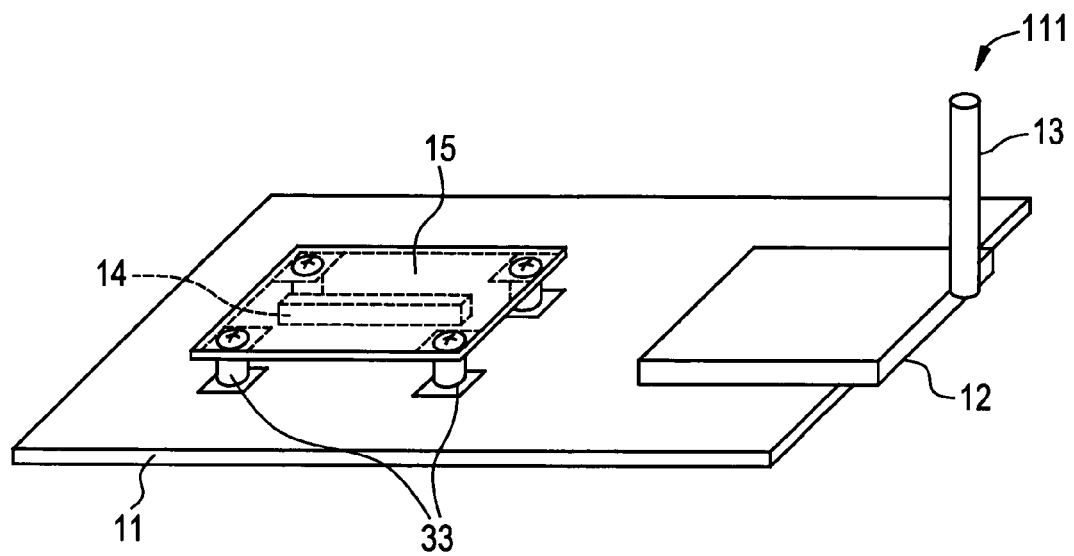
FIG. 31 is a perspective view illustrating the internal structure of the data processing terminal in one exemplary modification to the fourth embodiment.
Figure 32:
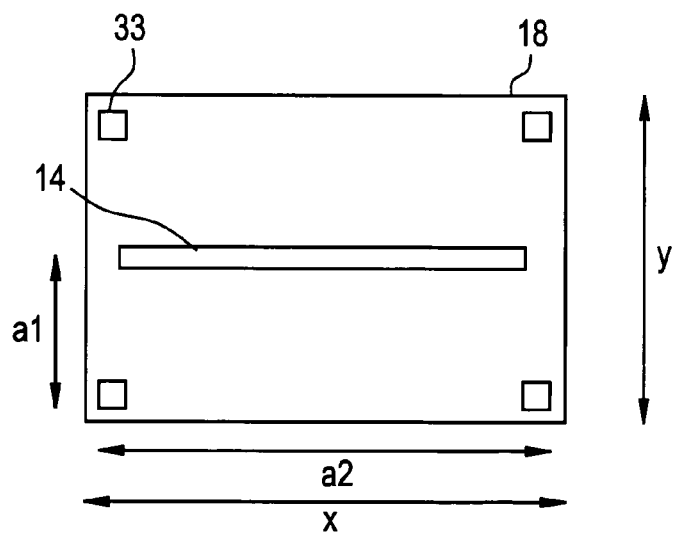
FIG. 32 is a plan view illustrating a layout pattern for a connector and auxiliary connecting means on the second ground plane.

While the foregoing embodiment has illustrated that connector 14 is disposed at the center of child board 15, and two auxiliary connecting means 33 are disposed one by one at the center on each of the pair of longer sides, four auxiliary connecting means can be disposed one by one at four corners of child board 15, as data processing terminal 111 illustrated in FIGS. 31 and 32 as a first exemplary modification to the foregoing embodiment.

In data processing terminal 111, distance a1 between one end of connector 14 and auxiliary connecting means 33, which is the longest distance between a plurality of ground connecting means along the continuous edges of second ground plane, satisfies "a<λ/2α" because distance a1 is calculated as "a1=y/2=12.5 (mm)".

Figure 33:
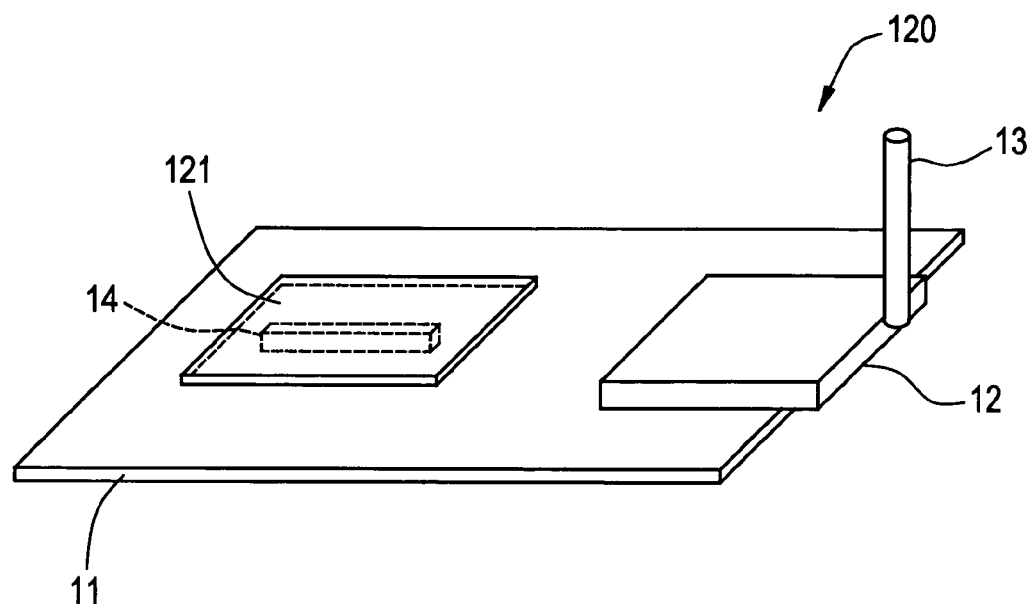
FIG. 33 is a perspective view illustrating the internal structure of a data processing terminal according to a fifth embodiment.
Figure 34:
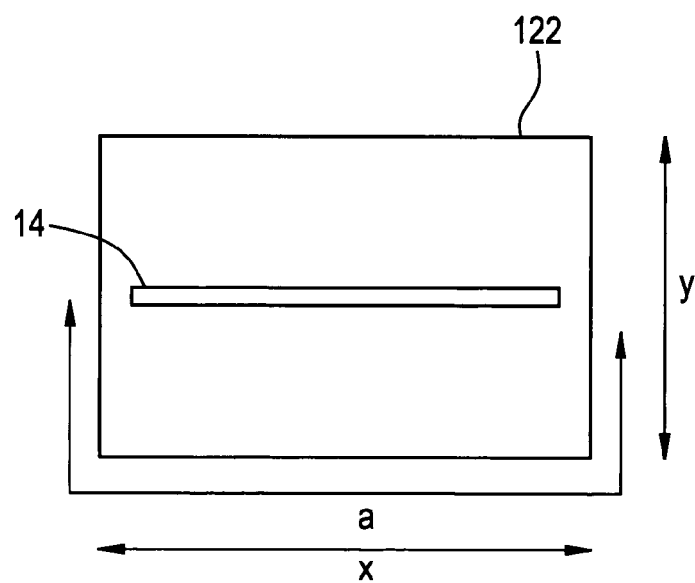
FIG. 34 is a top plan view illustrating a layout pattern for a connector on the second ground plane.

Next, a fifth embodiment of the present invention will be described below with reference to FIGS. 33 and 34. In data processing terminal 120 of this embodiment, child board 121 is formed smaller than child board 15 of the aforementioned data processing terminal 40 and the like, and connector 14, which is a ground connecting means, is disposed halfway between a pair of longer sides of child board 121 in parallel therewith.

In the configuration as described above, in data processing terminal 120 of this embodiment, child board 121 is formed smaller than that of the aforementioned data processing terminal 40 and the like, and has the longer sides of 30 (mm) (x=30) and the shorter sides of 15 (mm) (y=15). Thus, distance a between both ends of connector 14, which is the longest distance between a plurality of ground connecting means along the continuous edges of second ground plane 122, satisfies "a<λ/2α" because distance a is calculated as "a=x+y/2+y/2=45 (mm)".

Of course, even conventional data processing terminal 10 and the like can prevent communication failures if child board 15 is sufficiently reduced in size, so that when child board 121 having the aforementioned size is applied to the structure of data processing terminal 30 described above, communication failures can be prevented.

However, third exemplary conventional data processing terminal 30 requires connector 14 and auxiliary connecting means 33 in order to prevent communication failures using child board 121 having the aforementioned size, and conventional data processing terminals 10, 20, which have single connector 14, fail to prevent communication failures even using child board 121 having the aforementioned size.

In this respect, data processing terminal 120 of this embodiment having single connector 14 can prevent communication failures, provided that child board 121 has the aforementioned size, so that communication failures can be prevented in a simple structure, where single connector 14 is changed in position, without the need for adding auxiliary connecting means 33 and the like, as compared with the conventional structures.

Figure 35:
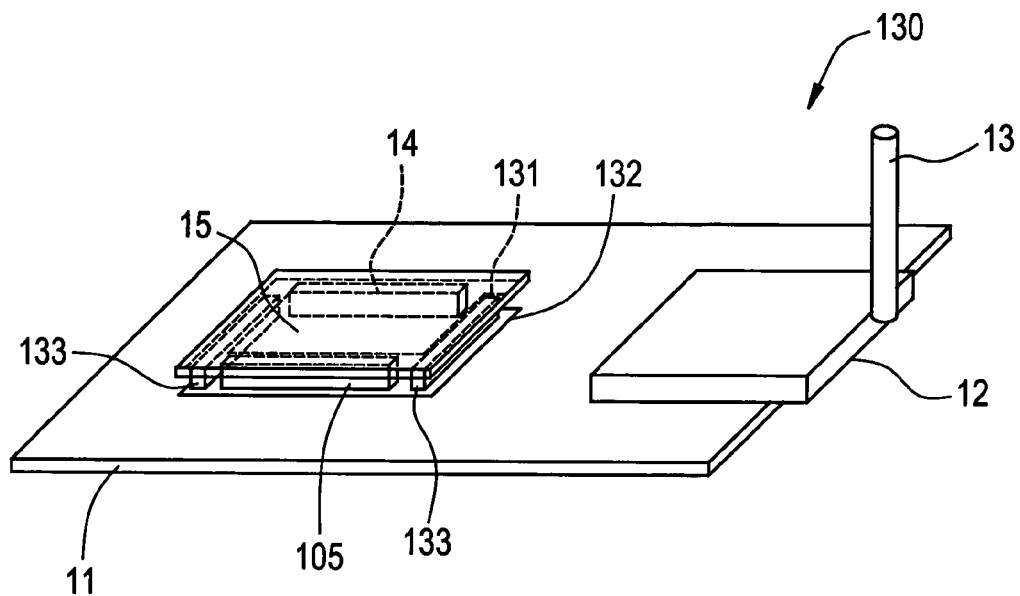
FIG. 35 is a perspective view illustrating the internal structure of a data processing terminal according to a sixth embodiment.

Next, a sixth embodiment of the present invention will be described below with reference to FIGS. 35 and 36. As illustrated in FIG. 35, data processing terminal 130 of this embodiment has connector 14 positioned along one longer side of rectangular child board 15, and inverted C-shaped ground terminal 131 formed along the other longer side and a pair of shorter sides, and ground terminal 132 in the same shape as this is formed on parent board 11 as well.

These ground terminals 131, 132 are interconnected through single linear metal member 105 parallel with the other longer side of child board 15 and two linear metal members 133 parallel with a pair of shorter sides, respectively, so that second ground plane 18 is linearly connected to first ground plane 17 near four edges in parallel therewith.

Figure 36:
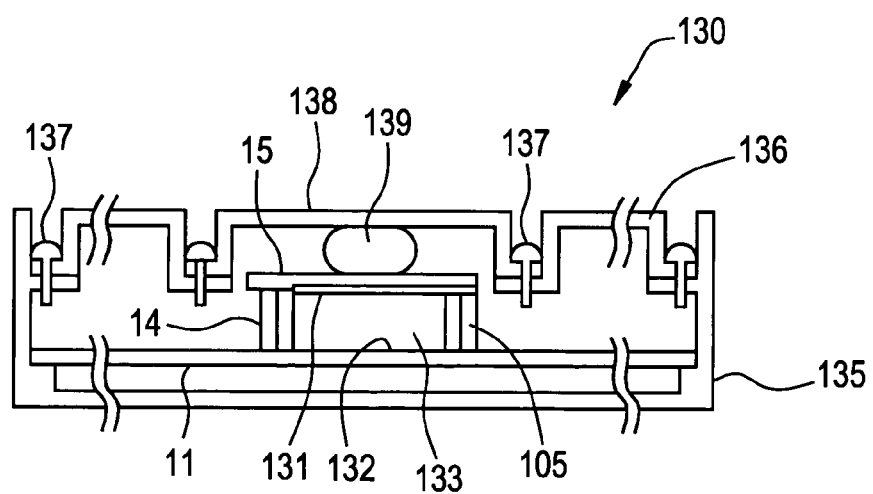
FIG. 36 is a vertical sectional view illustrating the internal structure at the position of a child board.

More specifically, as illustrated in FIG. 36, data processing terminal 130 of this embodiment comprises box-like housing 135 which has an open ceiling in the figure, and flat body cover 136 is fitted in the opening of housing 135 and fixed with screws 137.

Further, body cover 136 is formed with a rectangular opening at the position of child board 15, and flat board hutch 138 removably fitted in the opening hole is also fixed by screws 137. However, resilient body 139 is mounted on the bottom of substrate hutch 138, so that child board 15 is resiliently pressed onto parent board 11 by resilient body 139.

Since metal members 105, 133 have been previously mounted, for example, to ground terminal 132 of parent board 11, child board 15 is resiliently pressed by resilient body 139 to bring metal members 105, 133 into press contact with ground terminal 131 of child board 15 for making a connection therebetween.

In the configuration as described above, in data processing terminal 130 of this embodiment, second ground plane 18 of chile substrate 15 is linearly connected to first ground plane 17 of parent board 11 through connector 14 and metal members 105, 133 near the four edges thereof in parallel, so that second ground plane 18 will not act as an antenna which resonates with an electromagnetic field generated by data processing circuit 19.

Thus, data processing terminal 130 of this embodiment can prevent without fail second ground plane 18 from generating an electromagnetic field which impedes radio communications, irrespective of the communication wavelength of radio communication unit 12, the size of second ground plane 18, and the like, thereby satisfactorily carrying out radio communications.

Moreover, in data processing terminal 130 of this embodiment, connector 14 is included in the four ground connecting means which individually connects second ground plane 18 to first ground plane 17 along the four edges, and child board 15 is pressed by resilient body 139 for connection with metal members 105, 133 mounted on parent board 11, so that even when a general user mounts child board 15 on parent board 11, the four sides of second ground plane 18 can be securely connected to first ground plane 17.

Figure 37:
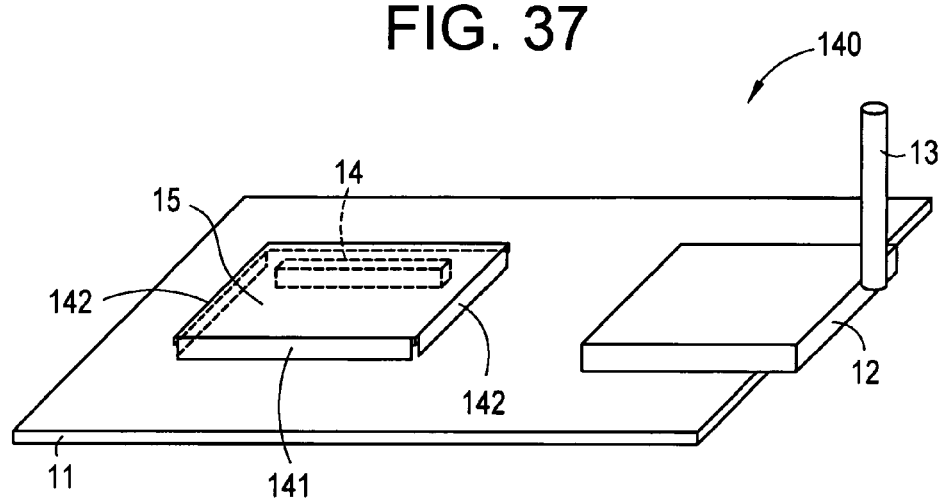
FIG. 37 is a perspective view illustrating the internal structure of the data processing terminal in one exemplary modification to the sixth embodiment.

While the foregoing embodiment has illustrated that child board 15 is pressed by resilient body 139 into connection with metal members 105, 133 mounted on parent board 11, three sides of second ground plane 18 can also be connected to first ground plane 17 through metal plates 141, 142, as data processing terminal 140 illustrated in FIG. 37 as one exemplary modification.

However, since difficulties are predicted in the application of data processing terminal 140 to a structure in which child board 15 is mounted by a general user, data processing terminal 140 is preferably applied to a product which is shipped with child board 15 previously mounted thereon.

Now, the results of experiments made by the inventors will be described with reference to FIGS. 38 to 46. First, the inventors installed an existing software application for an electromagnetic simulation based on an FDTD (Finite Differential Time Domain) method into a general personal computer to confirm electromagnetic fields generated by the aforementioned data processing terminals 10, 30, 40, 90, 91, 100 through the electromagnetic field simulation.

In this electromagnetic field simulation, first ground plane 17 was a complete conductor having a longitudinal length of 160 (mm), a transverse width of 70 (mm), and an infinite vertical thickness, while second ground plane 18 was a complete conductor having a longitudinal length of 40 (mm), a transverse width of 25 (mm), and an infinite vertical thickness.

Further, connector 14 was a complete conductor having a longitudinal length of 20 (mm), an infinite transverse width, and a vertical thickness of 4.0 (mm), and positioned along a longer side of second ground plane 18. Data processing circuit 19 was modeled by a complete conductor, a resistor having a load of 1.0 ($\Omega$), and a voltage supply having an internal impedance of 0 ($\Omega$), and had a transverse length of 5.0 (mm), an infinite longitudinal width, and a vertical thickness of 2.0 (mm).

Data processing circuit 19 was positioned on first ground plane 17 beneath the vicinity of the center of second ground plane 18 in a longitudinal direction which was orthogonal to connector 14. While data processing circuit 19 was essentially mounted across the entire parent board 11, the foregoing model was created for showing that even a signal wire of as short as 5.0 (mm) would cause second ground plane 18 to resonate.

A calculation area was defined by the transverse width of 170 (mm), the longitudinal length of 260 (mm), and the vertical width of 100 (mm) and a uniform mesh was set thereover every 5.0 (mm) along the transverse direction, every 5.0 (mm) along the longitudinal direction, and every 2.0 (mm) along the thickness direction. An absorption boundary condition for an outer wall of the calculation area was chosen to be 10-layer PML (Perfectly Matched Layer), and a frequency used in calculations was chosen to be 1.9 (GHz) corresponding to PHS.

Figure 38:
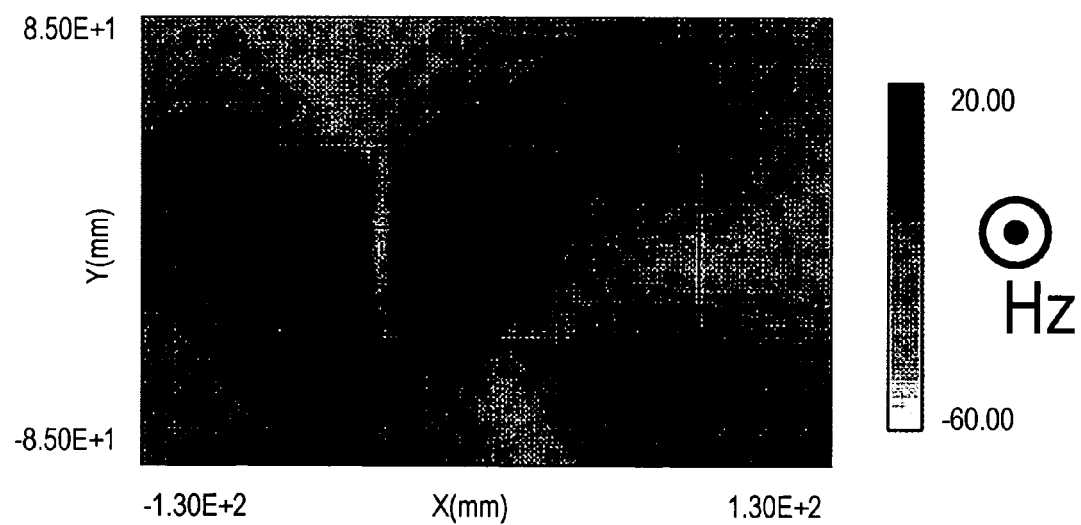
FIG. 38 is a top plan view showing the result of a simulation for a magnetic field strength in the first and second exemplary conventional data processing terminals.

In the conditions as described above, when a magnetic field strength was calculated at a height of 14 (mm) from first ground plane 17 of parent board 11, it was revealed, as shown in FIG. 38, that the magnetic field was strong particularly at both ends of second ground plane 18 in first/second exemplary conventional data processing terminals 10, 20.

Figure 39:
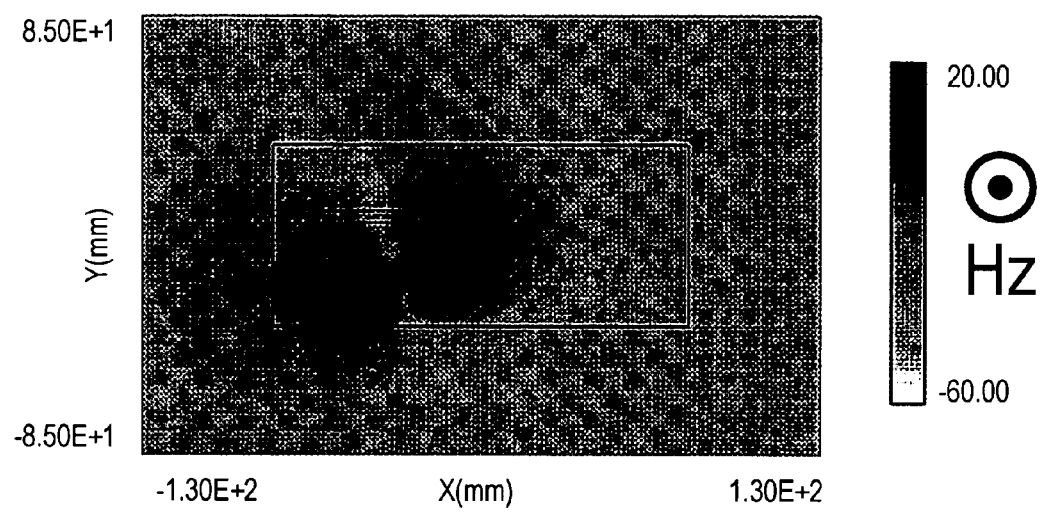
FIG. 39 is a top plan view showing the result of a simulation for a magnetic field strength in the third exemplary conventional data processing terminal.

FIG. 38 shows a stronger magnetic field in a deeper color, where one range converts to 4.0 (dB). Since a magnetic field is orthogonal to an electric field, second ground plane 18 generates a current in a transverse direction orthogonal to connector 14, causing child board 15 to generate an electromagnetic field at frequency of 1.9 (GHz). As shown in FIG. 39, in third exemplary conventional data processing terminal 30, the electromagnetic field strength, though reduced more or less, is even strong enough to impede PHS communications at low power.

Figure 40:
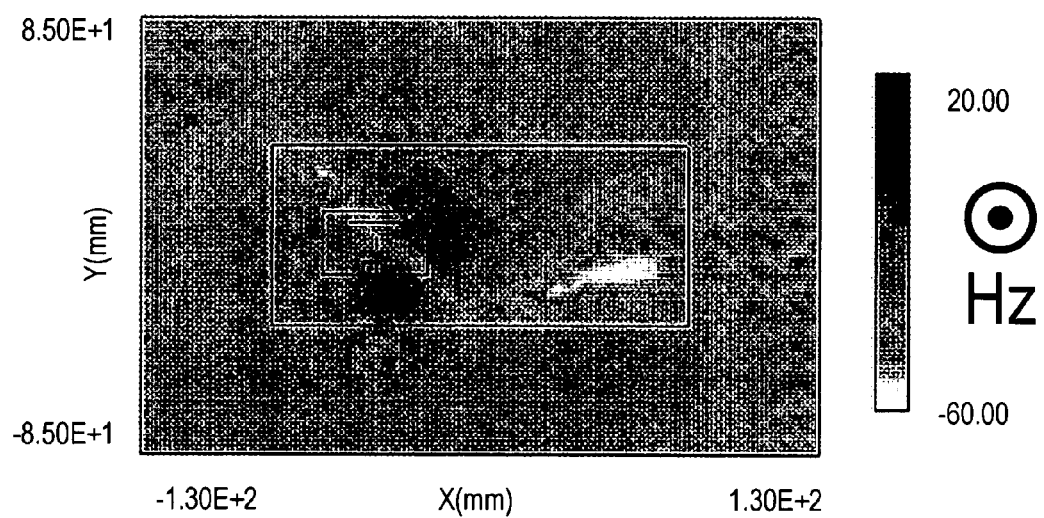
FIG. 40 is a top plan view illustrating the result of a simulation for a magnetic field strength in the data processing terminal according to the first embodiment.

As shown in FIG. 40, in data processing terminal 40 according to the first embodiment of the present invention, the electromagnetic field strength is generally reduced to an extreme, wherein the electromagnetic field strength at the right back corner of parent board 11 is reduced by approximately 29 (dB) as compared with conventional data processing terminals 10, 20.

Since second ground plane 18 is connected to first ground plane 17 at both ends in the transverse direction, it will not give rise to quarter wavelength resonance in the transverse direction. Though half wavelength resonance can occur, PHS communications will not be impeded if connector 14 is spaced by 20 (mm) away from auxiliary connecting means 33 because the resulting resonant frequency is at 7.5 (GHz).

Figure 41:
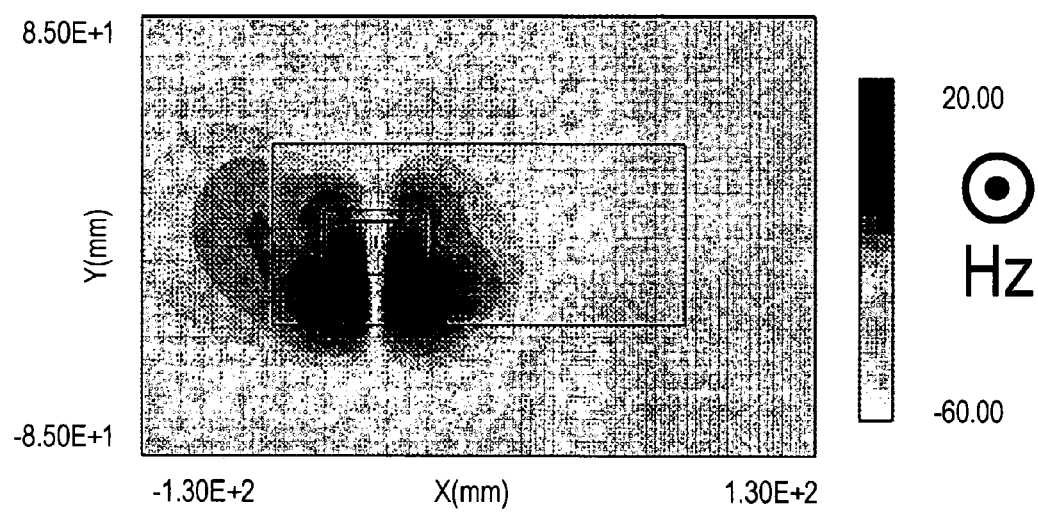
FIG. 41 is a top plan view showing the result of a simulation for a magnetic field strength in the data processing terminal in the first exemplary modification to the first embodiment.

As shown in FIG. 41, data processing terminal 90 also presents a generally reduced electromagnetic field strength, though not so much as the aforementioned data processing terminal 40. Presumably, this is because two auxiliary connecting means 33 are spaced by approximately 70 (mm) away from each other so that the half wavelength resonance occurs at resonant frequency of approximately 2.1 (GHz) which is closer to 1.9 (GHz) of the PHS communications.

Figure 42:
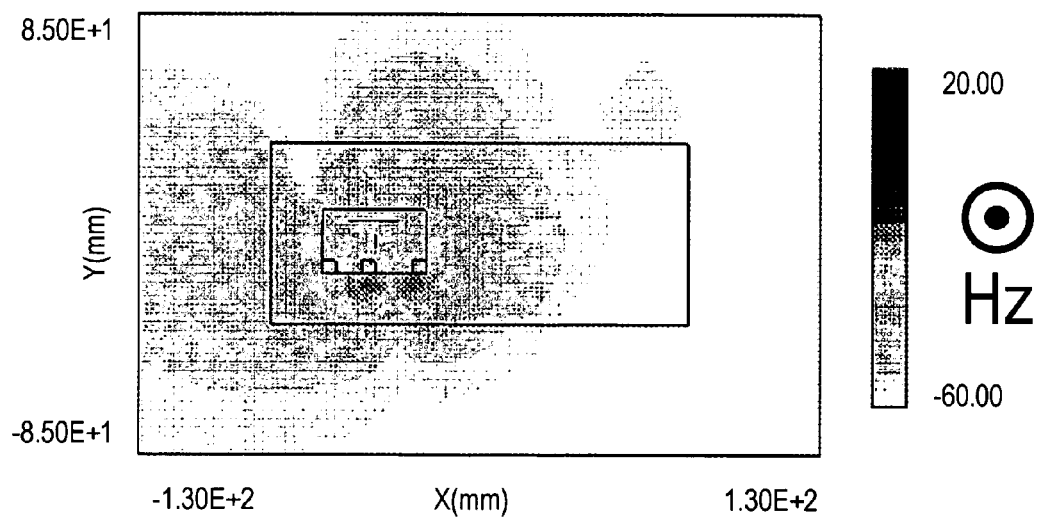
FIG. 42 is a top plan view showing the result of a simulation for a magnetic field strength in the data processing terminal in the second exemplary modification to the first embodiment.
Figure 43:
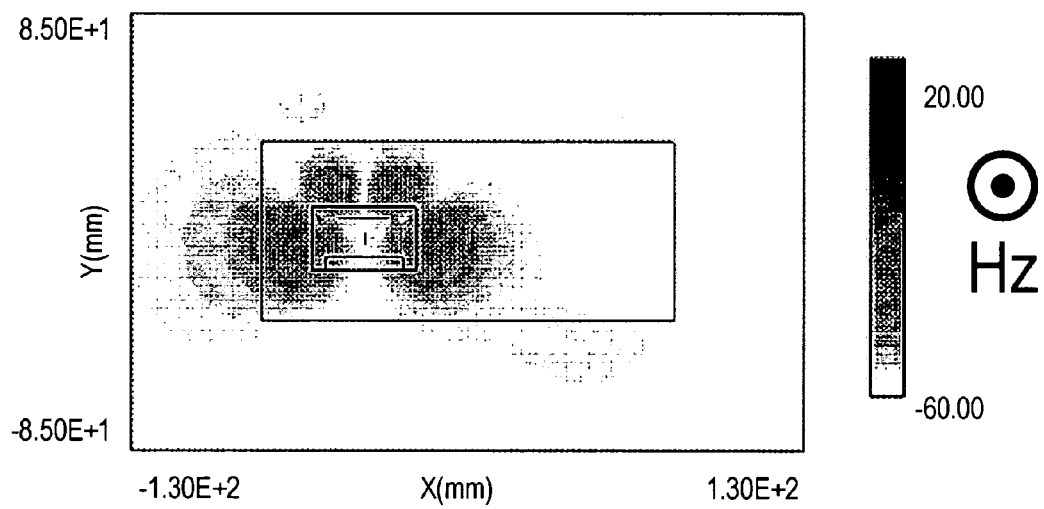
FIG. 43 is a top plan view showing the result of a simulation for a magnetic field strength in the data processing terminal according to the second embodiment.

As shown in FIG. 42, data processing terminal 91 further satisfactorily presents a generally reduced electromagnetic field strength, wherein the electromagnetic field strength at the right back corner of parent board 11, for example, is reduced by approximately 57 (dB) as compared with conventional data processing terminals 10, 20. Presumably, this is because three auxiliary connecting means 33 are spaced by approximately 30 (mm) away from one another, so that the half wavelength resonance occurs at resonant frequency of approximately 5 (GHz) which is away from 1.9 (GHz) of the PHS communications. Likewise, data processing terminal 100 presents a generally reduced electromagnetic field strength comparable to or more than that of aforementioned data processing terminal 91, as shown in FIG. 43.

Figure 44:
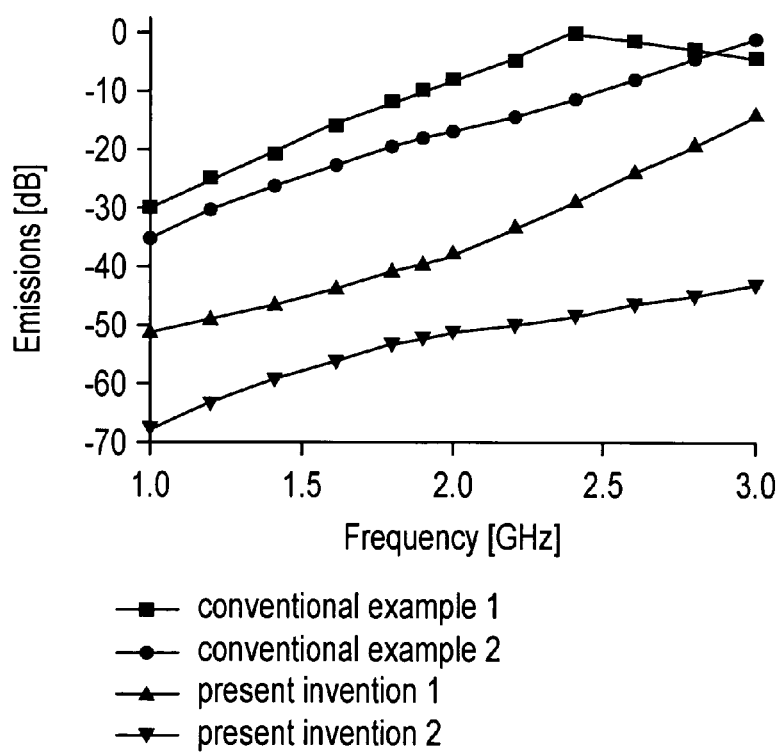
FIG. 44 is a characteristic graph showing the result of a simulation for a distant radiation electric field strength in the exemplary conventional data processing terminals and the data processing terminals according to the embodiments.

The inventors further calculated the frequency characteristic of distant radiation electric field strength in the aforementioned electromagnetic simulation for data processing terminals 10, 30, 40, 91, as shown in FIG. 44. In the calculation of the frequency characteristic, the origin was defined at the center of parent board 11, and maximum distant radiation electric field strength values were plotted on an XY-plane, a YX-plane, and a ZX-plane.

Also, all values were normalized by the value at 2.4 (GHz) of data processing terminal 10, where the calculation was made in a range of 1.0 to 3.0 (GHz). In FIG. 44, the calculation result for data processing terminal 10 is indicated by square; the calculation result for data processing terminal 30 by circle; the calculation result for data processing terminal 40 by triangle; and the calculation result for data processing terminal 91 by inverted triangle.

As is obvious from FIG. 44, a resonance-based peak exists at 2.4 (GHz) only in first exemplary conventional data processing terminal 10, whereas no peak exists in the calculation range of the remaining data processing terminals 30, 40, 90. Then, the electric field strength is reduced more in the order of data processing terminals 10, 30, 40, 90, from which a confirmation can be made that data processing terminals 40, 90 according to the embodiments of the present invention reduce the electromagnetic field more than exemplary conventional data processing terminals 10, 30. Though the distant radiation electric field strength is not directly related to electromagnetic interference by a nearby electromagnetic field, it can be estimated that electromagnetic interference is more likely to occur in the neighborhood as the distant radiation electric field strength is higher.

Figure 45:
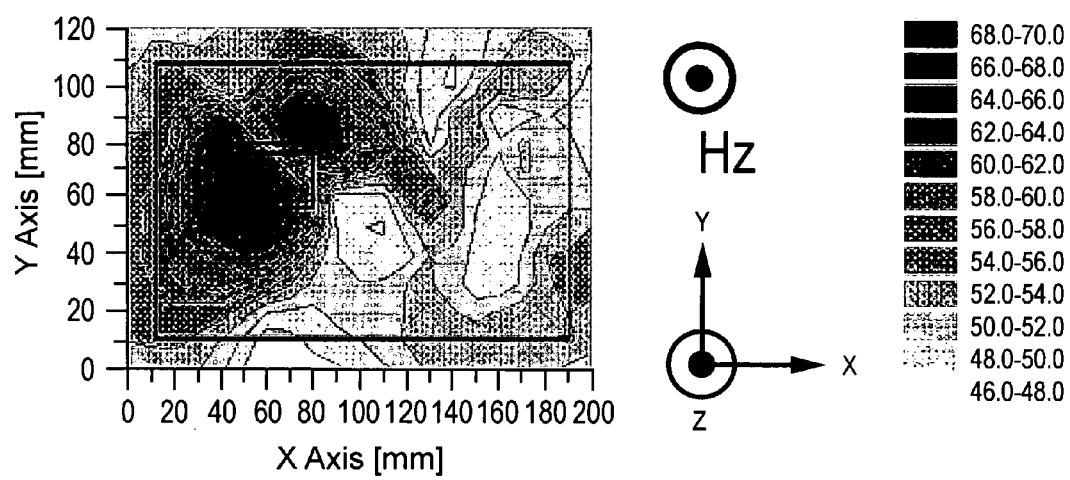
FIG. 45 is a top plan view showing the result of a measurement made on the magnetic field strength in the first exemplary conventional data processing terminal which was made on a trial basis.
Figure 46:
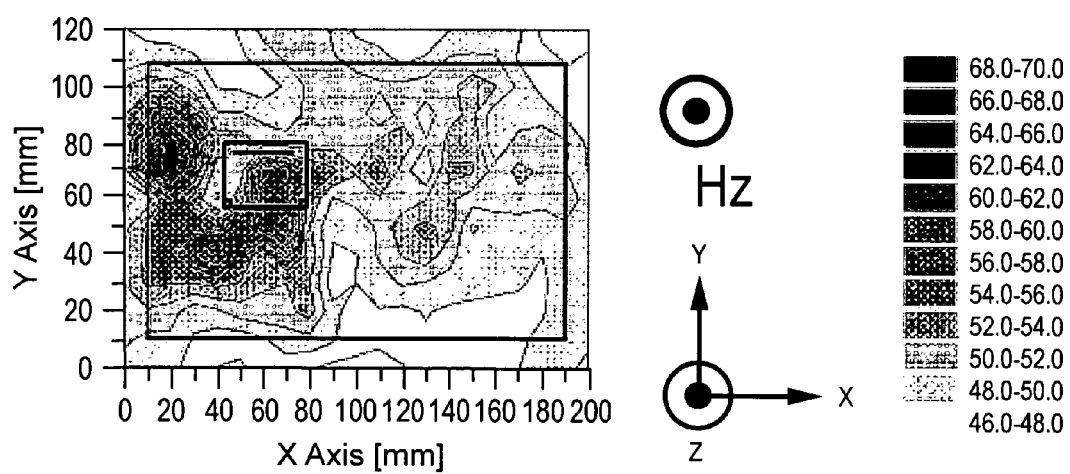
FIG. 46 is a top plan view showing the result of a measurement made on the magnetic field strength in the data processing terminal in the first exemplary modification to the first embodiment which was made on a trial basis.

Further, the inventors actually fabricated the aforementioned data processing terminals 10, 90 on a trial basis to measure the magnetic field strengths at frequency of 1.9 (GHz), as shown in FIGS. 45 and 46. In these figures, one range converts to 2.0 (dB). Then, as shown in FIG. 45, exemplary conventional data processing terminal 10 presented a magnetic field strength of approximately 70 (dB) at its maximum, whereas it was confirmed that data processing terminal 90 of the present invention presented approximately 60 (dB) at its maximum, which is lower by approximately 10 (dB).

Moreover, card-shaped radio communication unit 12 was disposed at a right end position of the aforementioned data processing terminals 10, 90 made on a trial basis for making PHS communications, to measure a induced voltage at a power supply of communication antenna 13. As a result, data processing terminal 90 of the present invention generated the induced voltage lower by approximately 10 (dB) than that of exemplary conventional data processing terminal 10, thereby confirming that data processing terminal 90 of the present invention could more satisfactorily carry out radio communications than exemplary conventional data processing terminal 10.

As described above, the present invention provides the following advantages.

In a first data processing terminal of the present invention, a plurality of ground connecting means connect a second ground plane to a first ground plane individually at a plurality of positions, wherein the longest distance a between the plurality of ground connecting means along continuous edges of the second ground plane satisfies "$a < \lambda/2\alpha$" ($\alpha$ is a coefficient equal to or larger than "1").

Accordingly, a portion of the second ground plane acts as a resonant antenna at a resonant frequency sufficiently higher than a communication frequency of a radio communication circuit, thereby making it possible to prevent an electromagnetic field generated by the second ground plane from impeding radio communications.

In another embodiment of the data processing terminal as described above, the longest distance b from a corner of one edge of the second ground plane to the ground connecting means satisfies "$b < \lambda/4\alpha$".

Accordingly, the portion of the second ground plane acts as a resonant antenna at a resonant frequency sufficiently higher than the communication frequency of the radio communication circuit, thus making it possible to prevent an electromagnetic field generated by the second ground plane from impeding radio communications.

Also, one edge of the second ground plane is linearly connected to the first ground plane through a connector, and an edge substantially parallel with that edge is connected to the first ground plane by auxiliary connecting means at least one point;

the two edges of the second ground plane substantially parallel with each other are linearly connected to the first ground plane by a connector and auxiliary connecting means;

one edge of the second ground plane is linearly connected to the first ground plane through a connector, and each of two edges substantially orthogonal to that edge is connected to the first ground plane by the auxiliary connecting means at least one point;

one edge of the second ground plane is linearly connected to the first ground plane through a connector, and each of two edges substantially orthogonal to that edge is linearly connected to the first ground plane by auxiliary connecting means;

one edge of the second ground plane is linearly connected to the first ground plane through a connector, one edge orthogonal to that edge is linearly connected to the first ground plane by first auxiliary connecting means, and corners of two edges, along which neither the first auxiliary connecting means nor connector is positioned, are connected at points of the first ground plane by second auxiliary connecting means;

a central portion of the second ground plane is linearly connected to the first ground plane by a connector substantially in parallel with two edges, and each of the two edges is connected to the first ground planes by auxiliary connecting means at least at one point;

two edges of the second ground plane substantially parallel with each other and a central portion of the second ground plane are linearly connected to the first ground plane by a connector and auxiliary connecting means substantially in parallel;

a central portion of the second ground plane is linearly connected to the first ground plane by a connector substantially in parallel with two edges thereof, and each of two edges substantially orthogonal to that edge is connected to the first ground plane at least at one point by auxiliary connecting means; and a central portion of the second ground plane is linearly connected to the first ground plane substantially in parallel with two edges thereof by a connector, and each of two edges substantially orthogonal to the edge is linearly connected to the first ground plane by auxiliary connecting means.

It is therefore possible to simply and securely implement a structure in which the longest distance a between a plurality of ground connecting means along the continuous edges of the second ground plane satisfies "$a<\lambda/2\alpha$", and a structure in which the longest distance b from a corner of one edge to the ground connecting means satisfies "$b<\lambda/4\alpha$".

In a second data processing terminal of the present invention, a second ground plane is linearly connected to a first ground plane through a connector at a halfway position substantially in parallel with two edges which oppose substantially in parallel with each other, and the longest distance a from one end to the other end of the connector along the continuous edges of the second ground plane satisfies "$a<\lambda/2\alpha$" ($\alpha$ is a coefficient equal to or larger than "1").

Accordingly, the portion of the second ground plane acts as a resonant antenna at a resonant frequency sufficiently higher than a communication frequency of a radio communication circuit, thus making it possible to prevent an electromagnetic field generated by the second ground plane from impeding radio communications.

Also, the longest distance b from a corner of one edge of the second ground plane to an end of the ground connecting means satisfies "$b<\lambda/4\alpha$".

Accordingly, the portion of the second ground plane acts as a resonant antenna at a resonant frequency sufficiently higher than the communication frequency of the radio communication circuit, thus making it possible to prevent an electromagnetic field generated by the second ground plane from impeding radio communications.

Also, the first ground plane, which comprises a first ground plane of a parent board mounted with a data processing circuit, is removably connected to the second ground plane, which comprises a first ground plane of a child board mounted with a memory circuit for temporarily storing data processed by the data processing circuit, through the connector, which comprises a connector.

Accordingly, though the child board connected to the parent board through the connector causes the child board to act as a resonant antenna which resonates with an electromagnetic field generated by the data processing circuit on the parent board, it is possible to prevent the electromagnetic field generated by the second ground plane from impeding radio communications because the resonant frequency is sufficiently higher than the communication frequency of the radio communication circuit.

In a third data processing terminal of the present invention, a second ground plane is linearly connected to a first ground plane near four edges thereof substantially in parallel with each other by ground connecting means.

Accordingly, since the second ground plane will not act as an antenna which resonates with an electromagnetic field generated by a data processing circuit, the electromagnetic field susceptible to the impediment of radio communications can be prevented from being generated from the second ground plane.

In a terminal designing method based on a first terminal designing apparatus of the present invention, pattern generating means generates a layout pattern for a plurality of ground connecting means based on a variety of stored data such that the longest distance a between the plurality of ground connecting means along continuous edges of a second ground plane satisfies "$a<\lambda/2\alpha$".

It is therefore possible to generate a layout pattern for the plurality of ground connecting means which do not impede radio communications.

Also, in another embodiment of the terminal designing method based on the terminal designing apparatus as described above, the pattern generating means generates a layout pattern such that the longest distance b from a corner of one edge of the second ground plane to the ground connecting means satisfies "$b<\lambda/4\alpha$".

It is therefore possible to generate a layout pattern for the plurality of ground connecting means which do not impede radio communications.

Also, in another embodiment of the terminal designing method based on the terminal designing apparatus as described above, a layout pattern for auxiliary connecting means is generated corresponding to a layout pattern for a connector substantially parallel with one edge of the second ground plane.

It is therefore possible to generate a layout pattern for the auxiliary connecting means corresponding to the layout pattern for the connector.

In a terminal designing method based on a second terminal designing apparatus of the present invention, pattern confirming means confirms based on data stored in a variety of storing means that the longest distance a between a plurality of ground connecting means along the continuous edges of the second ground plane satisfies $a<\lambda/2\alpha$".

It is therefore possible to confirm whether or not the layout pattern for the plurality of ground connecting means will not impede radio communications.

Also, the pattern confirming means additionally confirms that the longest distance b from a corner on one edge of the second ground plane to the ground connecting means satisfies "$b<\lambda/4\alpha$".

It is therefore possible to confirm whether or not the layout pattern for the plurality of ground connecting means will not impede radio communications.

What is claimed is:

1. A data processing terminal for performing data processing near a radio communication circuit for making radio communications at predetermined communication wavelength $\lambda$, said data processing terminal comprising:
a first ground plane comprised of a conductor which determines a potential reference;
a second ground plane comprised of a conductor in a predetermined shape having a plurality of edges and a plurality of corners, said second ground plane positioned substantially in parallel with said first ground plane;
a data processing circuit connected to at least one of said first ground plane and said second ground plane; and
a plurality of ground connecting means for connecting said second ground plane to said first ground plane individually at a plurality of positions near said edges,
wherein the longest distance a between a plurality of said ground connecting means along continuous edges of said second ground plane satisfies "a<$\lambda$/2$\alpha$" (where $\alpha$ is a coefficient equal to or larger than "1").

2. The data processing terminal according to claim 1, wherein the longest distance b from said corner on one of said edges of said second ground plane to said ground connecting means satisfies "b<$\lambda$/4$\alpha$".

3. The data processing terminal according to claim 2, wherein:
said second ground plane is formed in a shape of a rectangle having four corners formed substantially at right angles; and
said ground connecting means comprise an elongated connector positioned near one of said two substantially parallel edges of said second ground plane substantially in parallel therewith, and at least one point-like auxiliary connecting means positioned near the other of said two edges.

4. The data processing terminal according to claim 2, wherein:
said second ground plane is formed in a shape of a rectangle having four corners formed substantially at right angles; and
said ground connecting means comprise an elongated connector positioned near one of said two substantially parallel edges of said second ground plane substantially in parallel therewith, and linear auxiliary connecting means positioned near the other of said two edges substantially in parallel therewith.

5. The data processing terminal according to claim 2, wherein:
said second ground plane is formed in a shape of a rectangle having four corners formed substantially at right angles; and
said ground connecting means comprise an elongated connector positioned near one of said edges of said second ground plane substantially in parallel therewith, and point-like auxiliary connecting means positioned at least one by one near said two edges substantially orthogonal to said connector.

6. The data processing terminal according to claim 2, wherein:
said second ground plane is formed in a shape of a rectangle having four corners formed substantially at right angles; and
said ground connecting means comprise an elongated connector positioned near one of said edges of said second ground plane substantially in parallel therewith, and linear auxiliary connecting means positioned near each of said two edges substantially orthogonal to said connector substantially in parallel therewith.

7. The data processing terminal according to claim 2, wherein:
said second ground plane is formed in a shape of a rectangle having four corners formed substantially at right angles; and
said ground connecting means comprise an elongated connector positioned near one of said edges of said second ground plane substantially in parallel therewith, first linear auxiliary connecting means positioned near one of said edges orthogonal to said connector substantially in parallel therewith, and second point-like auxiliary connecting means positioned near a corner of said two edges near which neither said first auxiliary connecting means nor said connector are positioned.

8. The data processing terminal according to claim 2, wherein:
said second ground plane is formed in a shape of a rectangle having four corners formed substantially at right angles; and
said ground connecting means comprise an elongated connector positioned halfway between said two edges of said second ground plane opposite to each other and arranged substantially in parallel with said edges, and point-like auxiliary connecting means positioned at least one by one near said two edges substantially in parallel with said connector.

9. The data processing terminal according to claim 2, wherein:
said second ground plane is formed in a shape of a rectangle having four corners formed substantially at right angles; and
said ground connecting means comprise an elongated connector positioned halfway between said two edges of said second ground plane opposite to each other and arranged substantially in parallel with said edges, and linear auxiliary connecting means positioned one by one near said two edges substantially in parallel with said connector, substantially in parallel with said edges.

10. The data processing terminal according to claim 2, wherein:
said second ground plane is formed in a shape of a rectangle having four corners formed substantially at right angles; and
said ground connecting means comprise an elongated connector positioned halfway between said two edges of said second ground plane opposite to each other and arranged substantially in parallel with said edges, and point-like auxiliary connecting means positioned at least one by one near said two edges substantially orthogonal to said connector.

11. The data processing terminal according to claim 2, wherein:
said second ground plane is formed in a shape of a rectangle having four corners formed substantially at right angles; and
said ground connecting means comprise an elongated connector positioned halfway between said two edges of said second ground plane opposite to each other and arranged substantially in parallel with said edges, and linear auxiliary connecting means positioned near each of said two edges substantially orthogonal to said connector substantially in parallel with said each edge.

12. The data processing terminal according to claim 2, wherein:
said communication wavelength λ is approximately 159 (mm);
said distance b satisfies "b<39/α (mm)"; and
said distance a satisfies "a<79/α (mm)".

13. The data processing terminal according to claim 2, wherein:
said communication wavelength λ is approximately 150 (mm);
said distance b satisfies "b<38/α (mm)"; and
said distance a satisfies "a<75/α (mm)".

14. The data processing terminal according to claim 2, wherein:
said communication wavelength λ is approximately 125 (mm);
said distance b satisfies "b<31/α (mm)"; and
said distance a satisfies "a<63/α (mm)".

15. The data processing terminal according to claim 2, wherein:
said radio communication circuit is removably mounted; and
said radio communication circuit is in wired communication with said data processing circuit.

16. The data processing terminal according to claim 2, wherein:
said radio communication circuit is integrally formed; and
said radio communication circuit is in wired communication with said data processing circuit.

17. The data processing terminal according to claim 1, wherein:
said second ground plane is formed in a shape of a rectangle having four corners formed substantially at right angles; and
said ground connecting means comprise an elongated connector positioned near one of said two substantially parallel edges of said second ground plane substantially in parallel therewith, and at least one point-like auxiliary connecting means positioned near the other of said two edges.

18. The data processing terminal according to claim 17, wherein:
said first ground plane is formed on a parent board which is mounted with said data processing circuit;
said second ground plane is formed on a child board which is mounted with a memory circuit for temporarily storing data processed by said data processing circuit; and
said connector removably connects said child board to said parent board.

19. The data processing terminal according to claim 18, wherein:
said communication wavelength λ is approximately 159 (mm);
said distance b satisfies "b<39/α (mm)"; and
said distance a satisfies "a<79/α (mm)".

20. The data processing terminal according to claim 18, wherein:
said communication wavelength λ is approximately 150 (mm);
said distance b satisfies "b<38/α (mm)"; and
said distance a satisfies "a<75/α (mm)".

21. The data processing terminal according to claim 18, wherein:
said communication wavelength λ is approximately 125 (mm);
said distance b satisfies "b<31/α (mm)"; and
said distance a satisfies "a<63/α (mm)".

22. The data processing terminal according to claim 18, wherein:
said radio communication circuit is removably mounted; and
said radio communication circuit is in wired communication with said data processing circuit.

23. The data processing terminal according to claim 18, wherein:
said radio communication circuit is integrally formed; and
said radio communication circuit is in wired communication with said data processing circuit.

24. The data processing terminal according to claim 17, wherein:
said communication wavelength λ is approximately 159 (mm);
said distance b satisfies "b<39/α (mm)"; and
said distance a satisfies "a<79/α (mm)".

25. The data processing terminal according to claim 17, wherein:
said communication wavelength λ is approximately 150 (mm);
said distance b satisfies "b<38/α (mm)"; and
said distance a satisfies "a<75/α (mm)".

26. The data processing terminal according to claim 17, wherein:
said communication wavelength λ is approximately 125 (mm);
said distance b satisfies "b<31/α (mm)"; and
said distance a satisfies "a<63/α (mm)".

27. The data processing terminal according to claim 17, wherein:
said radio communication circuit is removably mounted; and
said radio communication circuit is in wired communication with said data processing circuit.

28. The data processing terminal according to claim 17, wherein:
said radio communication circuit is integrally formed; and
said radio communication circuit is in wired communication with said data processing circuit.

29. The data processing terminal according to claim 1, wherein:
said second ground plane is formed in a shape of a rectangle having four corners formed substantially at right angles; and
said ground connecting means comprise an elongated connector positioned near one of said two substantially parallel edges of said second ground plane substantially in parallel therewith, and linear auxiliary connecting means positioned near the other of said two edges substantially in parallel therewith.

30. The data processing terminal according to claim 29, wherein:
said first ground plane is formed on a parent board which is mounted with said data processing circuit;
said second ground plane is formed on a child board which is mounted with a memory circuit for temporarily storing data processed by said data processing circuit; and
said connector removably connects said child board to said parent board.

31. The data processing terminal according to claim 29, wherein:

said communication wavelength λ is approximately 159 (mm);
said distance b satisfies "b<39/α (mm)"; and
said distance a satisfies "a<79/α (mm)".

32. The data processing terminal according to claim 29, wherein:
said communication wavelength λ is approximately 150 (mm);
said distance b satisfies "b<38/α (mm)"; and
said distance a satisfies "a<75/α (mm)".

33. The data processing terminal according to claim 29, wherein:
said communication wavelength λ is approximately 125 (mm);
said distance b satisfies "b<31/α (mm)"; and
said distance a satisfies "a<63/α (mm)".

34. The data processing terminal according to claim 29, wherein:
said radio communication circuit is removably mounted; and
said radio communication circuit is in wired communication with said data processing circuit.

35. The data processing terminal according to claim 29, wherein:
said radio communication circuit is integrally formed; and
said radio communication circuit is in wired communication with said data processing circuit.

36. The data processing terminal according to claim 1, wherein:
said second ground plane is formed in a shape of a rectangle having four corners formed substantially at right angles; and
said ground connecting means comprise an elongated connector positioned near one of said edges of said second ground plane substantially in parallel therewith, and point-like auxiliary connecting means positioned at least one by one near said two edges substantially orthogonal to said connector.

37. The data processing terminal according to claim 36, wherein:
said first ground plane is formed on a parent board which is mounted with said data processing circuit;
said second ground plane is formed on a child board which is mounted with a memory circuit for temporarily storing data processed by said data processing circuit; and
said connector removably connects said child board to said parent board.

38. The data processing terminal according to claim 36, wherein:
said communication wavelength λ is approximately 159 (mm);
said distance b satisfies "b<39/α (mm)"; and
said distance a satisfies "a<79/α (mm)".

39. The data processing terminal according to claim 36, wherein:
said communication wavelength λ is approximately 150 (mm);
said distance b satisfies "b<38/α (mm)"; and
said distance a satisfies "a<75/α (mm)".

40. The data processing terminal according to claim 36, wherein:
said communication wavelength λ is approximately 125 (mm);
said distance b satisfies "b<31/α (mm)"; and
said distance a satisfies "a<63/α (mm)".

41. The data processing terminal according to claim 36, wherein:
said radio communication circuit is removably mounted; and
said radio communication circuit is in wired communication with said data processing circuit.

42. The data processing terminal according to claim 36, wherein:
said radio communication circuit is integrally formed; and
said radio communication circuit is in wired communication with said data processing circuit.

43. The data processing terminal according to claim 1, wherein:
said second ground plane is formed in a shape of a rectangle having four corners formed substantially at right angles; and
said ground connecting means comprise an elongated connector positioned near one of said edges of said second ground plane substantially in parallel therewith, and linear auxiliary connecting means positioned near each of said two edges substantially orthogonal to said connector substantially in parallel therewith.

44. The data processing terminal according to claim 43, wherein:
said first ground plane is formed on a parent board which is mounted with said data processing circuit;
said second ground plane is formed on a child board which is mounted with a memory circuit for temporarily storing data processed by said data processing circuit; and
said connector removably connects said child board to said parent board.

45. The data processing terminal according to claim 43, wherein:
said communication wavelength λ is approximately 159 (mm);
said distance b satisfies "b<39/α (mm)"; and
said distance a satisfies "a<79/α (mm)".

46. The data processing terminal according to claim 43, wherein:
said communication wavelength λ is approximately 150 (mm);
said distance b satisfies "b<38/α (mm)"; and
said distance a satisfies "a<75/α (mm)".

47. The data processing terminal according to claim 43, wherein:
said communication wavelength λ is approximately 125 (mm);
said distance b satisfies "b<31/α (mm)"; and
said distance a satisfies "a<63/α (mm)".

48. The data processing terminal according to claim 43, wherein:
said radio communication circuit is removably mounted; and
said radio communication circuit is in wired communication with said data processing circuit.

49. The data processing terminal according to claim 43, wherein:
said radio communication circuit is integrally formed; and
said radio communication circuit is in wired communication with said data processing circuit.

50. The data processing terminal according to claim 1, wherein:
said second ground plane is formed in a shape of a rectangle having four corners formed substantially at right angles; and said ground connecting means comprise an elongated connector positioned near one of said edges of said second ground plane substantially in parallel therewith, first linear auxiliary connecting means positioned near one of said edges orthogonal to said connector substantially in parallel therewith, and second point-like auxiliary connecting means positioned near a corner of said two edges near which neither said first auxiliary connecting means nor said connector are positioned.

51. The data processing terminal according to claim 50, wherein:
said first ground plane is formed on a parent board which is mounted with said data processing circuit;
said second ground plane is formed on a child board which is mounted with a memory circuit for temporarily storing data processed by said data processing circuit; and
said connector removably connects said child board to said parent board.

52. The data processing terminal according to claim 50, wherein:
said communication wavelength λ is approximately 159 (mm);
said distance b satisfies "b<39/α (mm)"; and
said distance a satisfies "a<79/α (mm)".

53. The data processing terminal according to claim 50, wherein:
said communication wavelength λ is approximately 150 (mm);
said distance b satisfies "b<38/α (mm)"; and
said distance a satisfies "a<75/α (mm)".

54. The data processing terminal according to claim 50, wherein:
said communication wavelength λ is approximately 125 (mm);
said distance b satisfies "b<31/α (mm)"; and
said distance a satisfies "a<63/α (mm)".

55. The data processing terminal according to claim 50, wherein:
said radio communication circuit is removably mounted; and
said radio communication circuit is in wired communication with said data processing circuit.

56. The data processing terminal according to claim 50, wherein:
said radio communication circuit is integrally formed; and
said radio communication circuit is in wired communication with said data processing circuit.

57. The data processing terminal according to claim 1, wherein:
said second ground plane is formed in a shape of a rectangle having four corners formed substantially at right angles; and
said ground connecting means comprise an elongated connector positioned halfway between said two edges of said second ground plane opposite to each other and arranged substantially in parallel with said edges, and point-like auxiliary connecting means positioned at least one by one near said two edges substantially in parallel with said connector.

58. The data processing terminal according to claim 57, wherein:
said second ground plane is formed in a shape of a rectangle having four corners formed substantially at right angles; and
said ground connecting means comprise an elongated connector positioned halfway between said two edges of said second ground plane opposite to each other and arranged substantially in parallel with said edges, and point-like auxiliary connecting means positioned at least one by one near said two edges substantially orthogonal to said connector.

59. The data processing terminal according to claim 57, wherein:
said second ground plane is formed in a shape of a rectangle having four corners formed substantially at right angles; and
said ground connecting means comprise an elongated connector positioned halfway between said two edges of said second ground plane opposite to each other and arranged substantially in parallel with said edges, and linear auxiliary connecting means positioned near each of said two edges substantially orthogonal to said connector substantially in parallel with said each edge.

60. The data processing terminal according to claim 57, wherein:
said first ground plane is formed on a parent board which is mounted with said data processing circuit;
said second ground plane is formed on a child board which is mounted with a memory circuit for temporarily storing data processed by said data processing circuit; and
said connector removably connects said child board to said parent board.

61. The data processing terminal according to claim 57, wherein:
said communication wavelength λ is approximately 159 (mm);
said distance b satisfies "b<39/α (mm)"; and
said distance a satisfies "a<79/α (mm)".

62. The data processing terminal according to claim 57, wherein:
said communication wavelength λ is approximately 150 (mm);
said distance b satisfies "b<38/α (mm)"; and
said distance a satisfies "a<75/α (mm)".

63. The data processing terminal according to claim 57, wherein:
said communication wavelength λ is approximately 125 (mm);
said distance b satisfies "b<31/α (mm)"; and
said distance a satisfies "a<63/α (mm)".

64. The data processing terminal according to claim 57, wherein:
said radio communication circuit is removably mounted; and
said radio communication circuit is in wired communication with said data processing circuit.

65. The data processing terminal according to claim 57, wherein:
said radio communication circuit is integrally formed; and
said radio communication circuit is in wired communication with said data processing circuit.

66. The data processing terminal according to claim 1, wherein:
said second ground plane is formed in a shape of a rectangle having four corners formed substantially at right angles; and
said ground connecting means comprise an elongated connector positioned halfway between said two edges of said second ground plane opposite to each other and arranged substantially in parallel with said edges, and linear auxiliary connecting means positioned one by one near said two edges substantially in parallel with said connector, substantially in parallel with said edges.

67. The data processing terminal according to claim 66, wherein:
said second ground plane is formed in a shape of a rectangle having four corners formed substantially at right angles; and
said ground connecting means comprise an elongated connector positioned halfway between said two edges of said second ground plane opposite to each other and arranged substantially in parallel with said edges, and point-like auxiliary connecting means positioned at least one by one near said two edges substantially orthogonal to said connector.

68. The data processing terminal according to claim 66, wherein:
said second ground plane is formed in a shape of a rectangle having four corners formed substantially at right angles; and
said ground connecting means comprise an elongated connector positioned halfway between said two edges of said second ground plane opposite to each other and arranged substantially in parallel with said edges, and linear auxiliary connecting means positioned near each of said two edges substantially orthogonal to said connector substantially in parallel with said each edge.

69. The data processing terminal according to claim 66, wherein:
said first ground plane is formed on a parent board which is mounted with said data processing circuit;
said second ground plane is formed on a child board which is mounted with a memory circuit for temporarily storing data processed by said data processing circuit; and
said connector removably connects said child board to said parent board.

70. The data processing terminal according to claim 66, wherein:
said communication wavelength λ is approximately 159 (mm);
said distance b satisfies "b<39/α (mm)"; and
said distance a satisfies "a<79/α (mm)".

71. The data processing terminal according to claim 66, wherein:
said communication wavelength λ is approximately 150 (mm);
said distance b satisfies "b<38/α (mm)"; and
said distance a satisfies "a<75/α (mm)".

72. The data processing terminal according to claim 66, wherein:
said communication wavelength λ is approximately 125 (mm);
said distance b satisfies "b<31/α (mm)"; and
said distance a satisfies "a<63/α (mm)".

73. The data processing terminal according to claim 66, wherein:
said radio communication circuit is removably mounted; and
said radio communication circuit is in wired communication with said data processing circuit.

74. The data processing terminal according to claim 66, wherein:
said radio communication circuit is integrally formed; and
said radio communication circuit is in wired communication with said data processing circuit.

75. The data processing terminal according to claim 1, wherein:
said second ground plane is formed in a shape of a rectangle having four corners formed substantially at right angles; and
said ground connecting means comprise an elongated connector positioned halfway between said two edges of said second ground plane opposite to each other and arranged substantially in parallel with said edges, and point-like auxiliary connecting means positioned at least one by one near said two edges substantially orthogonal to said connector.

76. The data processing terminal according to claim 75, wherein:
said first ground plane is formed on a parent board which is mounted with said data processing circuit;
said second ground plane is formed on a child board which is mounted with a memory circuit for temporarily storing data processed by said data processing circuit; and
said connector removably connects said child board to said parent board.

77. The data processing terminal according to claim 75, wherein:
said communication wavelength λ is approximately 159 (mm);
said distance b satisfies "b<39/α (mm)"; and
said distance a satisfies "a<79/α (mm)".

78. The data processing terminal according to claim 75, wherein:
said communication wavelength λ is approximately 150 (mm);
said distance b satisfies "b<38/α (mm)"; and
said distance a satisfies "a<75/α (mm)".

79. The data processing terminal according to claim 75, wherein:
said communication wavelength λ is approximately 125 (mm);
said distance b satisfies "b<31/α (mm)"; and
said distance a satisfies "a<63/α (mm)".

80. The data processing terminal according to claim 75, wherein:
said radio communication circuit is removably mounted; and
said radio communication circuit is in wired communication with said data processing circuit.

81. The data processing terminal according to claim 75, wherein:
said radio communication circuit is integrally formed; and
said radio communication circuit is in wired communication with said data processing circuit.

82. The data processing terminal according to claim 1, wherein:
said second ground plane is formed in a shape of a rectangle having four corners formed substantially at right angles; and
said ground connecting means comprise an elongated connector positioned halfway between said two edges of said second ground plane opposite to each other and arranged substantially in parallel with said edges, and linear auxiliary connecting means positioned near each of said two edges substantially orthogonal to said connector substantially in parallel with said each edge.

83. The data processing terminal according to claim 82, wherein:
said first ground plane is formed on a parent board which is mounted with said data processing circuit;

said second ground plane is formed on a child board which is mounted with a memory circuit for temporarily storing data processed by said data processing circuit; and said connector removably connects said child board to said parent board.

84. The data processing terminal according to claim 82, wherein:

said communication wavelength $\lambda$ is approximately 159 (mm);

said distance b satisfies "b<39/$\alpha$ (mm)"; and said distance a satisfies "a<79/$\alpha$ (mm)".

85. The data processing terminal according to claim 82, wherein:

said communication wavelength $\lambda$ is approximately 150 (mm);

said distance b satisfies "b<38/$\alpha$ (mm)"; and said distance a satisfies "a<75/$\alpha$ (mm)".

86. The data processing terminal according to claim 82, wherein:

said communication wavelength $\lambda$ is approximately 125 (mm);

said distance b satisfies "b<31/$\alpha$ (mm)"; and said distance a satisfies "a<63/$\alpha$ (mm)".

87. The data processing terminal according to claim 82, wherein:

said radio communication circuit is removably mounted; and said radio communication circuit is in wired communication with said data processing circuit.

88. The data processing terminal according to claim 82, wherein:

said radio communication circuit is integrally formed; and said radio communication circuit is in wired communication with said data processing circuit.

89. The data processing terminal according to claim 1, wherein:

said communication wavelength $\lambda$ is approximately 159 (mm);

said distance b satisfies "b<39/$\alpha$ (mm)"; and said distance a satisfies "a<79/$\alpha$ (mm)".

90. The data processing terminal according to claim 89, wherein:

said radio communication circuit is removably mounted; and said radio communication circuit is in wired communication with said data processing circuit.

91. The data processing terminal according to claim 89, wherein:

said radio communication circuit is integrally formed; and said radio communication circuit is in wired communication with said data processing circuit.

92. The data processing terminal according to claim 1, wherein:

said communication wavelength $\lambda$ is approximately 150 (mm);

said distance b satisfies "b<38/$\alpha$ (mm)"; and said distance a satisfies "a<75/$\alpha$ (mm)".

93. The data processing terminal according to claim 92, wherein:

said radio communication circuit is removably mounted; and said radio communication circuit is in wired communication with said data processing circuit.

94. The data processing terminal according to claim 92, wherein:

said radio communication circuit is integrally formed; and said radio communication circuit is in wired communication with said data processing circuit.

95. The data processing terminal according to claim 1, wherein:

said communication wavelength $\lambda$ is approximately 125 (mm);

said distance b satisfies "b<31/$\alpha$ (mm)"; and said distance a satisfies "a<63/$\alpha$ (mm)".

96. The data processing terminal according to claim 95, wherein:

said radio communication circuit is removably mounted; and said radio communication circuit is in wired communication with said data processing circuit.

97. The data processing terminal according to claim 95, wherein:

said radio communication circuit is integrally formed; and said radio communication circuit is in wired communication with said data processing circuit.

98. The data processing terminal according to claim 1, wherein:

said radio communication circuit is removably mounted; and said radio communication circuit is in wired communication with said data processing circuit.

99. The data processing terminal according to claim 1, wherein:

said radio communication circuit is integrally formed; and said radio communication circuit is in wired communication with said data processing circuit.

100. A data processing terminal for performing data processing near a radio communication circuit for making radio communications at a predetermined communication wavelength $\lambda$, said data processing terminal comprising:

a first ground plane comprised of a conductor which determines a potential reference;

a second ground plane comprised of a conductor in a predetermined shape having a plurality of edges and a plurality of corners, said second ground plane positioned substantially in parallel with said first ground plane;

a data processing circuit connected to at least one of said first ground plane and said second ground plane; and a connector positioned halfway between two of said edges opposing substantially in parallel with each other and arranged substantially in parallel with said edges for connecting said second ground plane to said first ground plane, wherein the longest distance a from one end to the other end of said connector along continuous edges of said second ground plane satisfies "a<$\lambda$/2$\alpha$" (where $\alpha$ is a coefficient equal to or larger than "1").

101. The data processing terminal according to claim 100, wherein the longest distance b from said corner on one of said edges of said second ground plane to said ground connecting means satisfies "b<$\lambda$/4$\alpha$".

102. The data processing terminal according to claim 101, wherein:

said first ground plane is formed on a parent board which is mounted with said data processing circuit;

said second ground plane is formed on a child board which is mounted with a memory circuit for temporarily storing data processed by said data processing circuit; and said connector removably connects said child board to said parent board.

103. The data processing terminal according to claim 101, wherein:
said communication wavelength λ is approximately 159 (mm);
said distance b satisfies "b<39/α (mm)"; and
said distance a satisfies "a<79/α (mm)".

104. The data processing terminal according to claim 101, wherein:
said communication wavelength λ is approximately 150 (mm);
said distance b satisfies "b<38/α (mm)"; and
said distance a satisfies "a<75/α (mm)".

105. The data processing terminal according to claim 101, wherein:
said communication wavelength λ is approximately 125 (mm);
said distance b satisfies "b<31/α (mm)"; and
said distance a satisfies "a<63/α (mm)".

106. The data processing terminal according to claim 101, wherein:
said radio communication circuit is removably mounted; and
said radio communication circuit is in wired communication with said data processing circuit.

107. The data processing terminal according to claim 101, wherein:
said radio communication circuit is integrally formed; and
said radio communication circuit is in wired communication with said data processing circuit.

108. The data processing terminal according to claim 100, wherein:
said first ground plane is formed on a parent board which is mounted with said data processing circuit;
said second ground plane is formed on a child board which is mounted with a memory circuit for temporarily storing data processed by said data processing circuit; and
said connector removably connects said child board to said parent board.

109. The data processing terminal according to claim 100, wherein:
said communication wavelength λ is approximately 159 (mm);
said distance b satisfies "b<39/α (mm)"; and
said distance a satisfies "a<79/α (mm)".

110. The data processing terminal according to claim 100, wherein:
said communication wavelength λ is approximately 150 (mm);
said distance b satisfies "b<38/α (mm)"; and
said distance a satisfies "a<75/α (mm)".

111. The data processing terminal according to claim 100, wherein:
said communication wavelength λ is approximately 125 (mm);
said distance b satisfies "b<31/α (mm)"; and
said distance a satisfies "a<63/α (mm)".

112. The data processing terminal according to claim 100, wherein:
said radio communication circuit is removably mounted; and
said radio communication circuit is in wired communication with said data processing circuit.

113. The data processing terminal according to claim 100, wherein:
said radio communication circuit is integrally formed; and
said radio communication circuit is in wired communication with said data processing circuit.

114. A terminal designing apparatus for use in designing a data processing terminal comprising a first ground plane comprised of a conductor which determines a potential reference, a second ground plane comprised of a conductor in a predetermined shape having a plurality of edges and a plurality of corners, said second ground plane positioned substantially in parallel with said first ground plane, a data processing circuit connected to at least one of sad first ground plane and said second ground plane, and ground connecting means for connecting said second ground plane to said first ground plane, said data processing terminal performing data processing using said data processing circuit near a radio communication circuit for making radio communications at predetermined communication wavelength λ, said terminal designing apparatus comprising:
wavelength input means for receiving said communication wavelength λ therethrough;
wavelength storing means for storing said communication wavelength λ entered through said wavelength input means;
coefficient input means for receiving a coefficient α equal to or larger than "1";
coefficient storing means for storing said coefficient α entered through said coefficient input means;
length input means for receiving lengths of two of said edges of said second ground plane substantially orthogonal to each other;
length storing means for storing said two lengths entered through said length input means; and
pattern generating means for generating a layout pattern for a plurality of said ground connecting means based on data stored in a variety of said storing means such that the longest distance a between a plurality of said ground connecting means along continuous edges of said second ground plane satisfies "a<λ/2α".

115. The terminal designing apparatus according to claim 114, wherein said pattern generating means generates said layout pattern such that the longest distance b from said corner on one of said edges of said second ground plane to said ground connecting means satisfies "b<λ/4α".

116. The terminal designing apparatus according to claim 115, wherein said pattern generating means comprises:
pattern input means for receiving a layout pattern for a connector substantially in parallel with one of said edges of said second ground plane, said connector forming part of said ground connecting means;
pattern storing means for storing the layout pattern for said connector entered through said pattern input means; and
auxiliary generating means for generating a layout pattern for auxiliary connecting means corresponding to the layout pattern for said connector stored in said pattern storing means, said auxiliary connecting means forming part of said ground connecting means.

117. The terminal designing apparatus according to claim 114, wherein said pattern generating means comprises:
pattern input means for receiving a layout pattern for a connector substantially in parallel with one of said edges of said second ground plane, said connector forming part of said ground connecting means;
pattern storing means for storing the layout pattern for said connector entered through said pattern input means; and auxiliary generating means for generating a layout pattern for auxiliary connecting means corresponding to the layout pattern for said connector stored in said pattern storing means, said auxiliary connecting means forming part of said ground connecting means.

118. A terminal designing apparatus for use in designing a data processing terminal comprising a first ground plane comprised of a conductor which determines a potential reference, a second ground plane comprised of a conductor in a predetermined shape having a plurality of edges and a plurality of corners, said second ground plane positioned substantially in parallel with said first ground plane, a data processing circuit connected to at least one of sad first ground plane and said second ground plane, and ground connecting means for connecting said second ground plane to said first ground plane, said data processing terminal performing data processing using said data processing circuit near a radio communication circuit for making radio communications at predetermined communication wavelength $\lambda$, said terminal designing apparatus comprising:

wavelength input means for receiving said communication wavelength $\lambda$ therethrough;

wavelength storing means for storing said communication wavelength $\lambda$ entered through said wavelength input means;

coefficient input means for receiving a coefficient $\alpha$ equal to or larger than "1";

coefficient storing means for storing said coefficient $\alpha$ entered through said coefficient input means;

length input means for receiving lengths of two of said edges of said second ground plane substantially orthogonal to each other;

length storing means for storing said two lengths entered through said length input means;

pattern input means for receiving a layout pattern for a plurality of said ground connecting means;

pattern storing means for storing said layout pattern entered through said pattern input means; and pattern confirming means for confirming based on data stored in a variety of said storing means that the longest distance a between a plurality of said ground connecting means along continuous edges of said second ground plane satisfies "$a<\lambda/2\alpha$".

119. The terminal designing apparatus according to claim 118, wherein said pattern confirming means additionally confirms that the longest distance b from said corner on one of said edges of said second ground plane to said ground connecting means satisfies "$b<\lambda/4\alpha$".

120. A terminal designing method for a terminal designing apparatus for use in designing a data processing terminal comprising a first ground plane comprised of a conductor which determines a potential reference, a second ground plane comprised of a conductor in a predetermined shape having a plurality of edges and a plurality of corners, said second ground plane positioned substantially in parallel with said first ground plane, a data processing circuit connected to at least one of sad first ground plane and said second ground plane, and a plurality of ground connecting means for connecting said second ground plane to said first ground plane individually at a plurality of positions near said edges, said data processing terminal performing data processing using said data processing circuit near a radio communication circuit for making radio communications at predetermined communication wavelength $\lambda$, said terminal designing method comprising:

receiving data entry of said communication wavelength $\lambda$;

storing said entered communication wavelength $\lambda$;

receiving data entry of a coefficient $\alpha$ equal to or larger than "1";

storing said entered coefficient $\alpha$;

receiving lengths of two of said edges of said second ground plane substantially orthogonal to each other;

storing said two entered lengths; and generating a layout pattern for a plurality of said ground connecting means based on a variety of stored data such that the longest distance a between a plurality of said ground connecting means along continuous edges of said second ground plane satisfies "$a<\lambda/2\alpha$".

121. The terminal designing method according to claim 120, further comprising generating said layout pattern such that the longest distance b from said corner on one of said edges of said second ground plane to said ground connecting means satisfies "$b<\lambda/4\alpha$".

122. The terminal designing method according to claim 120, further comprising additionally confirming that the longest distance b from said corner on one of said edges of said second ground plane to said ground connecting means satisfies "$b<\lambda/4\alpha$".

123. A terminal designing method for a terminal designing apparatus for use in designing a data processing terminal comprising a first ground plane comprised of a conductor which determines a potential reference, a second ground plane comprised of a conductor in a predetermined shape having a plurality of edges and a plurality of corners, said second ground plane positioned substantially in parallel with said first ground plane, a data processing circuit connected to at least one of sad first ground plane and said second ground plane, and a plurality of ground connecting means for connecting said second ground plane to said first ground plane individually at a plurality of positions near said edges, said data processing terminal performing data processing using said data processing circuit near a radio communication circuit for making radio communications at predetermined communication wavelength $\lambda$, said terminal designing method comprising:

receiving data entry of said communication wavelength $\lambda$;

storing said entered communication wavelength $\lambda$;

receiving data entry of a coefficient $\alpha$ equal to or larger than "1";

storing said entered coefficient $\alpha$;

receiving lengths of two of said edges of said second ground plane substantially orthogonal to each other;

storing said two entered lengths;

receiving data entry of a layout pattern for a plurality of said ground connecting means;

storing said entered layout pattern; and confirming based on a variety of stored data that the longest distance a between a plurality of said ground connecting means along continuous edges of said second ground plane satisfies "$a<\lambda/2\alpha$".

* * * * *